(12) United States Patent
Lu

(10) Patent No.: US 9,484,445 B2
(45) Date of Patent: *Nov. 1, 2016

(54) SEMICONDUCTOR DEVICE AND SEMICONDUCTOR DEVICE MANUFACTURING METHOD

(71) Applicant: FUJI ELECTRIC CO., LTD., Kawasaki-shi (JP)

(72) Inventor: Hong-fei Lu, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/532,292

(22) Filed: Nov. 4, 2014

(65) Prior Publication Data

US 2015/0054025 A1 Feb. 26, 2015

Related U.S. Application Data

(63) Continuation of application No. PCT/JP2013/068921, filed on Jul. 10, 2013.

(30) Foreign Application Priority Data

Aug. 22, 2012 (JP) .................. 2012-183092

(51) Int. Cl.
*H01L 29/06* (2006.01)
*H01L 29/32* (2006.01)
(Continued)

(52) U.S. Cl.
CPC ......... *H01L 29/7395* (2013.01); *H01L 21/265* (2013.01); *H01L 21/26506* (2013.01);
(Continued)

(58) Field of Classification Search
CPC ................ H01L 29/32; H01L 29/404; H01L 29/66333; H01L 29/7395; H01L 21/761; H01L 21/324; H01L 29/1095; H01L 29/0619
See application file for complete search history.

(56) References Cited

U.S. PATENT DOCUMENTS

H569 H * 1/1989 Varker et al. ............. 257/297
5,023,696 A * 6/1991 Ogino .................. 257/612
(Continued)

FOREIGN PATENT DOCUMENTS

EP 0837508 A2 4/1998
JP 58192368 A 11/1983
(Continued)

OTHER PUBLICATIONS

International Search Report issued in PCT/JP2013/066394 mailed Sep. 17, 2013. English translation provided.
(Continued)

*Primary Examiner* — Jarrett Stark
*Assistant Examiner* — Bitew Dinke
(74) *Attorney, Agent, or Firm* — Rossi, Kimms & McDowell LLP

(57) ABSTRACT

An n-type low lifetime adjustment region is provided in a portion inside an n⁻ type drift region deeper than the bottom surface of a termination p-type base region or p-type guard ring from a substrate front surface, separated from the termination p-type base region and the p-type guard ring. The carrier lifetime of the n-type low lifetime adjustment region is shorter than the carrier lifetime of the n⁻ type drift region. Because of this, it is possible to provide a reverse blocking IGBT such that it is possible to suppress both a high temperature reverse leakage current and an increase in turn-off loss, while suppressing deterioration in the trade-off relationship between the turn-off loss and the on-state voltage.

13 Claims, 16 Drawing Sheets

(51) Int. Cl.
  *H01L 29/739* (2006.01)
  *H01L 29/40* (2006.01)
  *H01L 29/66* (2006.01)
  *H01L 21/761* (2006.01)
  *H01L 21/265* (2006.01)
  *H01L 21/324* (2006.01)
  *H01L 29/10* (2006.01)

(52) U.S. Cl.
  CPC ........... *H01L21/324* (2013.01); *H01L 21/761* (2013.01); *H01L 29/0619* (2013.01); *H01L 29/1095* (2013.01); *H01L 29/32* (2013.01); *H01L 29/404* (2013.01); *H01L 29/66333* (2013.01)

(56) References Cited

U.S. PATENT DOCUMENTS

| | | | |
|---|---|---|---|
| 5,661,314 A | 8/1997 | Merrill et al. | |
| 5,751,024 A | 5/1998 | Takahashi | |
| 6,218,683 B1 | 4/2001 | Koga et al. | |
| 6,482,681 B1 | 11/2002 | Francis et al. | |
| 8,928,030 B2* | 1/2015 | Lu | 257/139 |
| 2002/0008246 A1* | 1/2002 | Francis | H01L 29/66136 257/104 |
| 2002/0048915 A1 | 4/2002 | Reznik | |
| 2002/0190281 A1 | 12/2002 | Francis et al. | |
| 2003/0062584 A1* | 4/2003 | Takahashi | H01L 21/263 257/458 |
| 2004/0041225 A1* | 3/2004 | Nemoto | 257/458 |
| 2004/0063302 A1* | 4/2004 | Takahashi et al. | 438/542 |
| 2005/0253169 A1* | 11/2005 | Suekawa | H01L 29/0834 257/197 |
| 2005/0258493 A1* | 11/2005 | Aono et al. | 257/370 |
| 2006/0286753 A1* | 12/2006 | Barthelmess | H01L 21/263 438/282 |
| 2007/0048982 A1* | 3/2007 | Nemoto et al. | 438/510 |
| 2007/0210386 A1* | 9/2007 | Mori | 257/359 |
| 2008/0315364 A1* | 12/2008 | Nemoto | 257/617 |
| 2009/0184338 A1* | 7/2009 | Hisamoto | 257/139 |
| 2010/0032711 A1* | 2/2010 | Aono et al. | 257/139 |
| 2011/0156210 A1 | 6/2011 | Yoshikawa | |
| 2013/0119432 A1* | 5/2013 | Lu | 257/139 |
| 2013/0264674 A1* | 10/2013 | Mizushima | 257/487 |
| 2014/0077253 A1* | 3/2014 | Soeno | H01L 29/32 257/139 |
| 2014/0117406 A1* | 5/2014 | Kakefu | 257/139 |
| 2014/0246755 A1* | 9/2014 | Yoshimura et al. | 257/617 |
| 2015/0014742 A1* | 1/2015 | Lu | 257/139 |
| 2015/0060938 A1* | 3/2015 | Lu | 257/139 |

FOREIGN PATENT DOCUMENTS

| | | |
|---|---|---|
| JP | 04229660 A | 8/1992 |
| JP | 10178174 A | 6/1998 |
| JP | 2002076017 A * | 3/2002 |
| JP | 3288218 B2 | 6/2002 |
| JP | 2002184987 A | 6/2002 |
| JP | 2002319676 A | 10/2002 |
| JP | 2002532885 A | 10/2002 |
| JP | 2003533047 A | 11/2003 |
| JP | 2004165619 A | 6/2004 |
| JP | 2007059550 A | 3/2007 |
| JP | 4128777 B2 | 7/2008 |
| JP | 2009224794 A | 10/2009 |
| JP | 2011155257 A | 8/2011 |
| WO | 9963597 A1 | 12/1999 |
| WO | 2007055352 A1 | 5/2007 |
| WO | 2012056536 A1 | 5/2012 |
| WO | WO 2012056536 A1 * | 5/2012 |
| WO | 2012081664 A1 | 6/2012 |
| WO | 2013136898 A1 | 9/2013 |

OTHER PUBLICATIONS

Office Action issued in U.S. Appl. No. 14/505,659 mailed Jul. 2, 2015.
Office Action issued in U.S. Appl. No. 14/505,659 mailed Mar. 30, 2016.
Silber et al. "Improved Dynamic Properties of GTO-Thyristors and Diodes by Proton Implantation"; IEEE; 1985.
International Search Report issued in PCT/JP2013/068921, dated Oct. 15, 2013. English translation provided.
Office Action issued in Japanese Appln No. 2014-531545 dated May 12, 2015. English translation provided.

\* cited by examiner

SEMICONDUCTOR DEVICE AND SEMICONDUCTOR DEVICE MANUFACTURING METHOD

BACKGROUND OF THE INVENTION

A. Field of the Invention

The present invention relates to a semiconductor device and semiconductor device manufacturing method.

B. Description of the Related Art

High breakdown voltage discrete power devices fulfil a central role in power conversion devices. As examples of this kind of power devices, there are an insulated gate bipolar transistor (IGBT), a metal-oxide-semiconductor field effect transistor (MOSFET), and the like. An IGBT, being a conductivity modulating type of bipolar device, has a low on-state voltage compared with that of a MOSFET, which is a unipolar device, because of which IGBTs are particularly widely used in switching circuits, and the like, in which are mounted high breakdown voltage devices whose on-state voltage is liable to be high.

Furthermore, in order to adapt the power conversion device so as to be a matrix converter with higher conversion efficiency, bidirectional switching devices are necessary. A reverse blocking IGBT having reverse breakdown voltage of the same extent as the forward breakdown voltage is attracting attention as a semiconductor device configuring this bidirectional switching device. The reason for this is that the bidirectional switching device can easily be configured by the reverse blocking IGBT being connected in anti-parallel. The reverse blocking IGBT is a device wherein the p-n junction between the collector region and drift region in a normal IGBT is improved so as to be able to maintain reverse blocking voltage using a termination structure with high voltage withstanding reliability. Because of this, the reverse blocking IGBTs are suitable as switching devices mounted in the AC-AC power converting matrix converter or in a DC-AC converting multilevel inverter.

Referring to FIG. 12, a description will be given hereafter of the structure of a heretofore known reverse blocking IGBT. FIG. 12 is a sectional view showing a main portion of the heretofore known reverse blocking IGBT. As shown in FIG. 12, the reverse blocking IGBT is also such that, in the same way as a normal IGBT, an active region 110 is provided in the vicinity of the center of a chip, and an edge termination structure portion 120 is provided on an outer peripheral side surrounding the active region 110. Further, the reverse blocking IGBT is characterized by having an isolation region 130 enclosing the outer side of the edge termination structure portion 120. The isolation region 130 has as a main region a $p^+$ type isolation layer 31 for linking one main surface and the other main surface of an $n^-$ type semiconductor substrate with a p-type region.

In order to form the $p^+$ type isolation layer 31 using thermal diffusion of a p-type impurity from the one main surface of the $n^-$ type semiconductor substrate, it is necessary to form the $p^+$ type isolation layer 31 extremely deep, which involves a thermal diffusion drive at a high temperature for a long time. Owing to the $p^+$ type isolation layer 31, the structure can be such that the termination of a p-n junction plane between a p-type collector region 10 and $n^-$ type drift region 1, which is a reverse direction voltage withstanding junction, is not exposed on a chip side end surface 12 that forms the cutting plane when fabricating chips. Furthermore, the p-n junction plane between the p-type collector region 10 and $n^-$ type drift region 1, as well as not being exposed on the chip side end surface 12, is exposed on a substrate surface (substrate front surface side surface) 13 of the edge termination structure portion 120 protected by a dielectric 14. Because of this, it is possible to increase reverse direction voltage withstanding reliability.

The active region 110 is a region forming a path for the main current of a vertical IGBT including a front surface side structure formed of the $n^-$ type drift region 1, a p-type base region 2, an $n^+$ type emitter region 3, a gate dielectric 4, a gate electrode 5, an interlayer dielectric 6, an emitter electrode 9, and the like, and a back surface structure of the p-type collector region 10, a collector electrode 11, and the like. Furthermore, the depth of a termination p-type base region (an outermost p-type base region of the active region 110) 2-1 of a termination portion 110a of the active region 110 near the edge termination structure portion 120 is larger than that of the p-type base region 2 inward of the termination p-type base region 2-1. An n-type high concentration region 1a with resistivity lower than that of the $n^-$ type drift region 1, and of a depth larger than that of the p-type base region 2, is formed in a surface layer of the $n^-$ type drift region 1 below the gate electrode 5 between neighboring p-type base regions 2, thus reducing the on-state voltage.

The edge termination structure portion 120 includes a p-type guard ring 7 and a field plate 8 for relaxing the electrical field intensity, which is liable to become high when a forward direction voltage is applied (the collector electrode 11 is connected to a positive electrode while the emitter electrode 9 is connected to a negative electrode) and when reverse direction voltage is applied (the collector electrode 11 is connected to a negative electrode while the emitter electrode 9 is connected to a positive electrode), and the dielectric 14 as a termination protection film of the p-n junction exposed on the substrate surface 13. The p-type guard ring 7, preferably being formed deeper than the p-type base region 2, is formed simultaneously with the termination p-type base region 2-1.

Meanwhile, when using a normal IGBT in the previously described inverter and the like, it is necessary to connect a free wheeling diode (hereafter abbreviated to FWD) in anti-parallel to the IGBT. Also, the FWD is such that, in order to improve reverse recovery characteristic, the carrier lifetime of the drift region of the FWD (hereafter referred to simply as lifetime) is sometimes adjusted so as to vary locally.

A sectional view of this kind of FWD wherein the lifetime locally varies is shown in FIG. 15(a). FIG. 15 illustrates a sectional structure and lifetime profile of a heretofore known diode. FIG. 15(a) is the sectional structure of the FWD, while FIG. 15(b) shows the profile (distribution), with the depth direction of a semiconductor substrate configuring the FWD as the horizontal axis, and the lifetime as the vertical axis. The structure of the FWD of FIG. 15 is described hereafter. In this semiconductor diode (FWD), a p-type semiconductor region 105 is provided in a surface layer on the front surface side of an $n^-$ type semiconductor substrate with a low $n^-$ type impurity concentration. An anode electrode 109 is provided in contact with the front surface of the p-type semiconductor region 105. An $n^+$ type high concentration region 115 is provided in a surface layer on the back surface side of the $n^-$ type semiconductor substrate. A cathode electrode 112 is provided in contact with the $n^+$ type high concentration region 115. A portion sandwiched by the p-type semiconductor region 105 and $n^+$ type high concentration region 115 is an $n^-$ type low impurity concentration region (hereafter referred to as an $n^-$ type low concentration region 102) remaining at the original impurity concentration of the $n^-$ type semiconductor substrate.

The n⁻ type low concentration region 102, which forms a drift region, is adjusted so that the lifetime differs according to place. Specifically, the n⁻ type low concentration region 102 includes first to third lifetime adjustment regions 102a to 102c adjusted to different lifetimes. The first lifetime adjustment region 102a is positioned to the p-type semiconductor region 105 side of the n⁻ type low concentration region 102, in contact with the whole surface of the p-type semiconductor region 105. The third lifetime adjustment region 102c is positioned in the center of the device between the first lifetime adjustment region 102a and n⁺ type high concentration region 115. The second lifetime adjustment region 102b is adjacent to the third lifetime adjustment region 102c and surrounding the third lifetime adjustment region 102c, between the first lifetime adjustment region 102a and n⁺ type high concentration region 115. When comparing the lifetimes of each of the first to third lifetime adjustment regions 102a to 102c after lifetime adjustment, the lifetimes are such that the first lifetime adjustment region 102a<the second lifetime adjustment region 102b<the third lifetime adjustment region 102c.

It is known that this kind of localized lifetime adjustment may be introduced by diffusing precious metal such as gold (Au) or platinum (Pt) selectively into a predetermined region, or by a selective irradiation of a predetermined region with radioactive rays such as electrons (for example, refer to International Publication No. WO 99/63597 (Page 15, Line 14 to Line 19)).

It is commonly known that a silicon semiconductor substrate can be doped to an n-type by an ion implantation of charged hydrogen (protons) followed by a low temperature annealing. The relationship between the proton dose and the impurity concentration after activation when the annealing conditions are 350° C. and 30 minutes, or the like, has already been published (for example, refer to D. Silber et al., "Improved Dynamic Properties of GTO-Thyristors and Diodes by Proton Implantation", International Electron Devices Meeting (IEDM) Digest 1985, (U.S.A.), 1985, Volume 31, Pages 162 to 165)).

It is also already known that an n⁺ buffer layer of the IGBT is formed using a proton implantation and thermal annealing technology. Outlines of a typical device structure and doping profile of each portion are shown in FIG. 16 and FIG. 17 respectively. FIG. 16 is a sectional view showing a main portion of another example of a heretofore known IGBT. FIG. 17 is a doping profile diagram of the heretofore known IGBT of FIG. 16. After an IGBT surface structure (reference signs 25 to 29) is formed on the front surface of an n⁻ type semiconductor substrate, and the n⁻ type semiconductor substrate is thinned by grinding from the back surface, an n⁺ buffer layer 24 shown in FIG. 16 is formed by one or a plurality of proton implantations (for example, the three times $N_{H1}$ to $N_{H3}$ of FIG. 17) with an acceleration energy of 500 KeV or less, and a subsequent thermal annealing at a temperature of 300° C. to 400° C. for 30 minutes to 60 minutes. The proton dose and annealing conditions necessary to form the n⁺ buffer layer 24 are easily determined by referring to D. Silber et al., "Improved Dynamic Properties of GTO-Thyristors and Diodes by Proton Implantation", International Electron Devices Meeting (IEDM) Digest 1985, (U.S.A.), 1985, Volume 31, Pages 162 to 165. The advantage of forming the n⁺ buffer layer 24 using a proton doping method is that the annealing temperature necessary to activate the n⁺ buffer layer 24 can be around approximately 350° C., which does not adversely affect a previously formed metal electrode film in the surface structure. With regard to reference signs not in the previous description of FIG. 16 and FIG. 17, reference sign 22 is an n⁻ type drift region, reference sign 25 is a p-type base region, reference sign 26 is an n⁺ type emitter region, reference sign 27 is a gate dielectric, reference sign 28 is a gate electrode, reference sign 29 is an emitter electrode, reference sign 31 is a p⁻ type collector region, and reference sign 32 is a collector electrode (for example, refer to U.S. Pat. No. 6,482,681 Description (FIG. 1, FIG. 6) and Japanese U.S. Pat. No. 4,128,777 (FIG. 1, FIG. 6)).

For the reverse blocking IGBT, when the gate is off and voltage is applied in a reverse direction (the collector electrode is connected to a lower electrostatic potential than the emitter electrode), there is sometimes a problem that large reverse leakage current occurs. FIG. 13 is an illustration showing a main portion sectional structure, and an electric field intensity profile when reverse direction voltage is applied, of a heretofore known reverse blocking IGBT. A simplified sectional view in a substrate vertical direction (the thickness direction of the semiconductor substrate) of a single cell, particularly the termination portion 110a and gate pad portion (not shown) thereof, in the active region 110 of FIG. 12 is shown on the left side of FIG. 13. The electric field intensity distribution when reverse direction voltage is applied is shown on the right side of FIG. 13. When reverse direction voltage is applied, a drift region 1-2 on the p-type collector region 10 side of the n⁻ type drift region 1 is depleted along with the extension of a depletion layer from the collector junction (the p-n junction between the p-type collector region 10 and the n⁻ type drift region 1), and a net n-type base 1-1 (a drift region on the p-type base region 2 side of the n⁻ type drift region 1 that is not depleted) of a p-n-p transistor formed of a p-type emitter (the p-type base region 2), an n-type base (the n⁻ type drift region 1), and the p-type collector region 10 becomes thinner. Furthermore, combined with the p-type emitter concentration being high and the injection efficiency thereof also being high, the leakage current generated in the depletion layer region (the drift region 1-2) is amplified by the p-n-p transistor, and the device leakage current increases, as a result of which there is a problem that the element operating temperature (heat resistance) is limited.

Also, in the event that reverse direction voltage is applied in a state wherein collector quality is low, such as when there are a large number of defects in the p-type collector region 10, or in a state wherein the p-type collector region 10 boron dose is too small, there is a concern that the depletion layer spreading from the p-n junction between the p-type collector region 10 and n⁻ type drift region 1 also spreads to the thin p-type collector region 10 side, and could punch through to the collector electrode 11. In which case, the reverse leakage current increases significantly. In order to overcome this kind of problem of the reverse leakage current increasing, it is known to be preferable that the p-type collector region 10 is locally highly activated using a YAG laser (for example, refer to JP-A-2007-59550 (Paragraph 0009)). Also, it is also known that, in order to suppress an increase in switching loss due to the remaining of highly injected hole carriers from the p-type collector region 10 accompanying the localized high activation of the p-type collector region 10, it is good when the annealing temperature after electron irradiation is kept low at around 330° C., thus reducing the lifetime of the n⁻ type drift region 1.

Also, there is a description relating to a reverse blocking IGBT wherein, by providing a lifetime killer layer inside a drift region near a collector region, the reverse recovery peak current of the reverse blocking IGBT operated as a diode is reduced, thus imparting soft recovery characteristics (for example, refer to JP-A-2002-76017 (Abstract, FIG. 1)).

Also, there is also known technology relating to a diode wherein, by providing a high concentration region in a central portion of the thickness of a drift region using proton irradiation, an increase in dV/dt when there is reverse recovery is suppressed, thus imparting soft recovery characteristics (for example, refer to JP-A-2009-224794 (Abstract, FIG. 1)).

The present invention is directed to overcoming or at least reducing the effects of one or more of the problems set forth above.

SUMMARY OF THE INVENTION

However, the small lifetime of the whole of the n⁻ type drift region 1 of the reverse blocking IGBT shown in FIG. 13 has a drawback of increasing recombination centers with the drift region 1-2 when reverse direction voltage is applied on the one hand, causing the reverse leakage current to increase. Also, reducing the reverse leakage current of the heretofore known reverse blocking IGBT by increasing the lifetime, as shown by an arrow in FIG. 14, is not desirable as, although the on-state voltage decreases, a problem arises in that turn-off loss increases. FIG. 14 is a characteristic diagram showing a trade-off relationship between Eoff and Von of the heretofore known reverse blocking IGBT. The previously described small lifetime can also be referred to as a short lifetime, and increasing the lifetime can also be referred to as extending the lifetime. Also, a method whereby a thickness W of the n⁻ type drift region 1 is increased is also effective in reducing the reverse leakage current. In this case, however, the trade-off relationship between Eoff (turn-off loss) and Von (on-state voltage) deteriorates to a worse level, as shown in FIG. 14, meaning that the method whereby the thickness W of the n⁻ type drift region 1 is increased is not desirable either.

The invention, in order to resolve the heretofore described problems with the heretofore known technology, has an object of providing a semiconductor device and semiconductor device manufacturing method such that it is possible to suppress both high temperature reverse leakage current and an increase in turn-off loss, while suppressing deterioration in the trade-off relationship between turn-off loss and on-state voltage.

In order to resolve the previously described problems, a semiconductor device according to one aspect of the invention has the following characteristics. An active region has a MOS gate structure on one main surface side of an n⁻ type semiconductor substrate. The MOS gate structure is formed of a p-type base region, an n⁺ type emitter region, a gate dielectric, and a gate electrode. The p-type base region is selectively provided on the one main surface side of the n⁻ type semiconductor substrate. The n⁺ type emitter region is selectively provided inside the p-type base region. The gate electrode is provided across the gate dielectric on the surface of a portion of the p-type base region sandwiched by an n⁻ type drift region and the n⁺ type emitter region. An edge termination structure portion surrounds the outer periphery of the active region. A second conductivity type collector layer provided on the other main surface side of the n⁻ type semiconductor substrate, and a p⁺ type isolation layer is provided in an outer peripheral portion of the edge termination structure portion so as to link the one main surface and other main surface of the n⁻ type semiconductor substrate. The p⁺ type isolation layer is electrically connected to the p-type collector layer. An n-type low lifetime adjustment region is provided separated from the p-type base region in a position inside the n⁻ type drift region deeper than the bottom surface of the p-type base region from the one main surface of the n⁻ type semiconductor substrate. The n-type low lifetime adjustment region is provided from the active region to the p⁺ type isolation layer. A carrier lifetime $t_1$ of the n-type low lifetime adjustment region, being shorter than a carrier lifetime $t_2$ of the n⁻ type drift region, has a relationship such that $t_2 > t_1$.

The semiconductor device according to the aspect of the invention may be such that the depth of the outermost termination p-type base region in the active region is greater than the depth of the p-type base region positioned inward of the relevant termination p-type base region.

The semiconductor device according to the aspect of the invention may be such that the depth of the outermost termination p-type base region in the active region is equal to the depth of a p-type guard ring configuring the edge termination structure portion.

Also, the semiconductor device according to the aspect of the invention may further include an n-type high concentration region of an impurity concentration higher than that of the n⁻ type drift region, provided at a depth such that the bottom surface is positioned between the p-type base region positioned inward of the outermost termination p-type base region in the active region and the n-type low lifetime adjustment region in a portion of the n⁻ type drift region sandwiched between neighboring p-type base regions.

Also, it is preferable that the semiconductor device according to the aspect of the invention is such that the carrier lifetime $t_1$ of the n-type low lifetime adjustment region, with the carrier lifetime $t_2$ of the n⁻ type drift region in a range of 0.2 μs to 3.0 μs, has a relationship such that $t_2/t_1$ is 2 to 8.

It is preferable that the semiconductor device according to the aspect of the invention is such that a peak concentration $n_1$ of the doping concentration of the n-type low lifetime adjustment region, being higher than a doping concentration $n_2$ of the n⁻ type drift region, has a relationship such that $n_1 > n_2$.

It is preferable that the semiconductor device according to the aspect of the invention is such that the peak concentration n1 of the doping concentration of the n-type low lifetime adjustment region, being lower than four times the doping concentration $n_2$ of the n⁻ type drift region, has a relationship such that $n_1 < 4n_2$.

It is preferable that the semiconductor device according to the aspect of the invention is such that the center in the depth direction of the n-type low lifetime adjustment region is positioned in a depth range of within 20 μm to the p-type collector layer side from the bottom surface of the outermost second conductivity type base region in the active region.

In order to resolve the previously described problems, a semiconductor device manufacturing method according to one aspect of the invention is characterized in that, after the MOS gate structure and a required metal electrode film are formed on the one main surface side of the n⁻ type semiconductor substrate, the n-type low lifetime adjustment region is formed by protons being implanted from the other main surface side of the n⁻ type semiconductor substrate, and a thermal annealing process being carried out.

It is preferable that the semiconductor device manufacturing method according to the aspect of the invention is such that the protons are implanted in an energy range of $5.0 \times 10^{13}$ cm⁻² to $5.0 \times 10^{14}$ cm⁻², and the thermal annealing process is carried out in a hydrogen atmosphere at a temperature of 330° C. to 380° C.

It is preferable that the semiconductor device manufacturing method according to the aspect of the invention is such that, after the MOS gate structure and a required metal electrode film are formed on the one main surface side of the n⁻ type semiconductor substrate, the n-type low lifetime adjustment region is formed by helium irradiation from the other main surface side of the n⁻ type semiconductor substrate, and a thermal annealing process being carried out.

It is preferable that the semiconductor device manufacturing method according to the aspect of the invention is such that the helium is ion implanted in an energy range of 2.0 MeV to 5.5 MeV, and the thermal annealing process is carried out in a hydrogen atmosphere at a temperature of 380° C. or less.

It is preferable that the semiconductor device manufacturing method according to the aspect of the invention is such that, furthermore, the lifetime of the n-type low lifetime adjustment region is adjusted by electron irradiation.

Also, it is preferable that the semiconductor device manufacturing method according to the aspect of the invention is such that the doping peak concentration of the n-type low lifetime adjustment region is adjusted to be within four times the doping concentration of the n– type drift region.

According to the semiconductor device and the semiconductor device manufacturing method according to the invention, it is possible to considerably suppress high temperature reverse leakage current and a collector voltage jump peak when turning off, while suppressing deterioration in the trade-off between turn-off loss and on-state voltage, by providing an n-type low lifetime adjustment region separated from the bottom surfaces of the outermost p-type base region of the active region and the p-type guard ring of the edge termination structure portion to the emitter side of an element. As a result of this, it is possible to increase reliability with respect to overheat and overvoltage.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
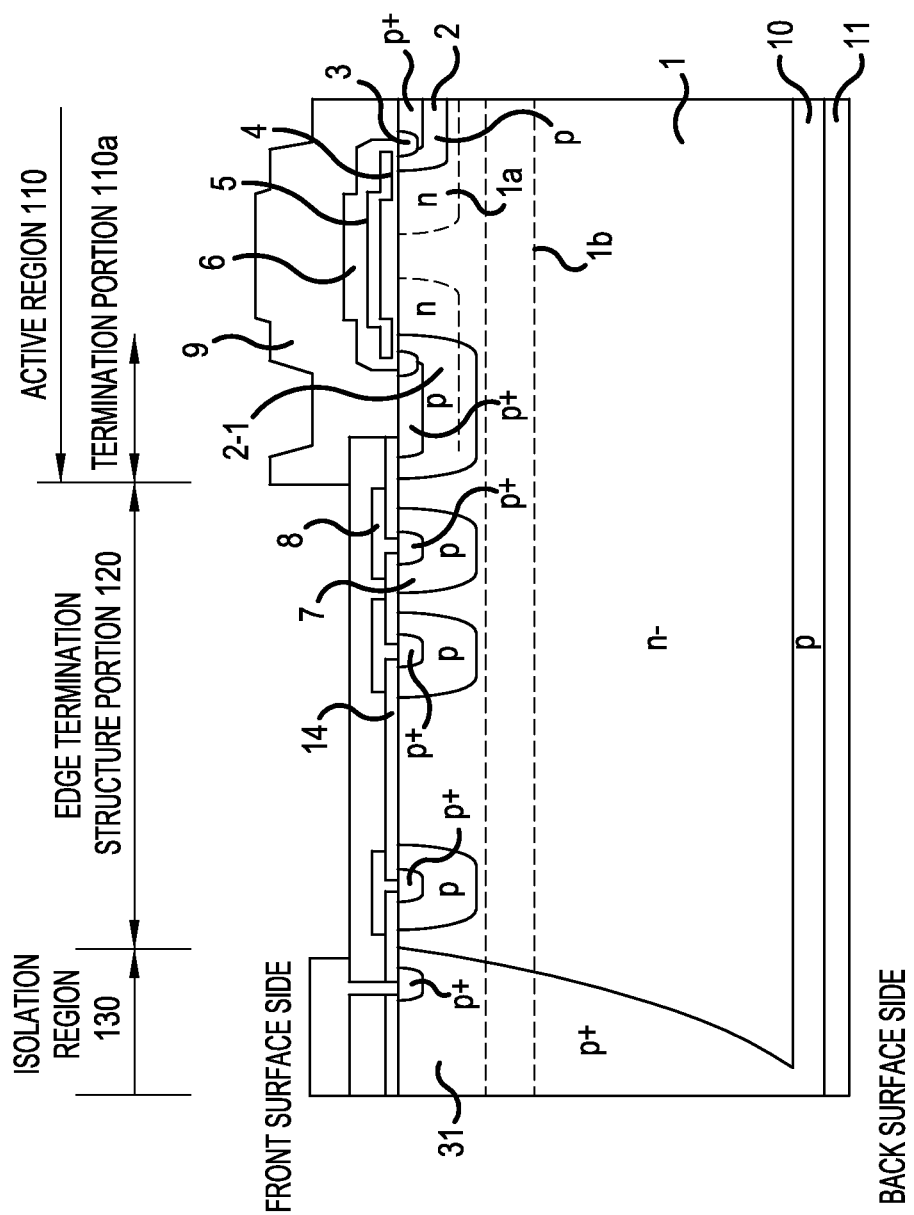
FIG. 1 is a sectional view showing a main portion of a reverse blocking IGBT according to the invention.

Hereafter, referring to the drawings, a detailed description will be given of a preferred embodiment and examples of a semiconductor device and a semiconductor device manufacturing method according to the invention. A layer or a region being prefixed by n or p in the description and attached drawings means that electrons or holes respectively are majority carriers. Also, + or – attached to n or p means that the impurity concentration is relatively higher or lower respectively than that of a layer or a region to which neither is attached. The same reference signs are given to the same configurations in the following description of the embodiment and examples and in the attached drawings, and redundant descriptions are omitted. Also, for the sake of easier viewing and easier understanding, the attached drawings described in the embodiment and examples are not drawn to an accurate scale or dimensional ratio. Provided that the scope of the invention is not exceeded, the invention is not limited to the details of the embodiment and examples described hereafter.

Embodiment

A description will be given of a sectional structure of the semiconductor device according to the invention, with a reverse blocking IGBT as an example. FIG. 1 is a sectional view showing a main portion of the reverse blocking IGBT according to the invention. As shown in FIG. 1, the reverse blocking IGBT according to an embodiment of the invention includes an active region 110 provided in the vicinity of the center of a chip, an edge termination structure portion 120 provided on an outer peripheral side surrounding the active region 110, and an isolation region 130 enclosing the outer side of the edge termination structure portion 120. In the active region 110, a surface structure formed of a p-type base region 2, a p⁺ type base contact region, an n⁺ type emitter region 3, a gate dielectric 4, a gate electrode 5, an interlayer dielectric 6, an emitter electrode 9, and the like, is provided on the front surface side of an n⁻ type semiconductor substrate forming an n⁻ type drift region 1. The active region 110 is a region that is a route of the main current. The edge termination structure portion 120 is a region that relaxes an electrical field on the substrate front surface side of the n⁻ type drift region 1, thus maintaining breakdown voltage. The isolation region 130 has as a main region a p⁺ type isolation layer 31 for linking one main surface and the other main surface of the n⁻ type semiconductor substrate with a p-type region.

An n-type low lifetime adjustment region 1b, whose carrier lifetime (hereafter referred to simply as lifetime) is adjusted to be lower than that of the n⁻ type drift region 1, is provided from the active region 110 to the isolation region 130 on the substrate front surface side inside the n⁻ type drift region 1. The n-type low lifetime adjustment region 1b is provided in a position deeper from the substrate front surface than the bottom surfaces of a termination p-type base region (an outermost p-type base region provided in a termination portion 110a on the edge termination structure portion 120 side of the active region 110) 2-1 and a p-type guard ring 7 of the edge termination structure portion 120, separated from the termination p-type base region 2-1. Also, the center in the depth direction of the n-type low lifetime adjustment region 1b is positioned within approximately 20 μm of the bottom surface of the termination p-type base region 2-1 or the p-type guard ring 7 of the edge termination structure portion 120. It is not desirable that the center of the n-type low lifetime adjustment region 1b exceeds approximately 20 μm from the bottom surface of the termination p-type base region 2-1 or p-type guard ring 7, as the breakdown voltage drops.

Example 1

Next, a description will be given of a doping concentration profile and a lifetime profile of the n-type low lifetime adjustment region 1b and an n⁻ type drift region 1, while comparing a main embodiment of the reverse blocking IGBT of the invention with a heretofore known reverse blocking IGBT. FIG. 2 is characteristic diagrams showing a doping concentration profile and a lifetime profile of the reverse blocking IGBT of FIG. 1. Herein, the heretofore known reverse blocking IGBT forming the comparison target is a reverse blocking IGBT that does not include the n-type low lifetime adjustment region 1b, which is a characteristic portion of the reverse blocking IGBT of the invention. That is, as regards the structure other than an n-type low lifetime adjustment region, the heretofore known reverse blocking IGBT used in the following description has a structure essentially the same as that of the reverse blocking IGBT of the invention, as shown in FIG. 12.

Figure 2A:
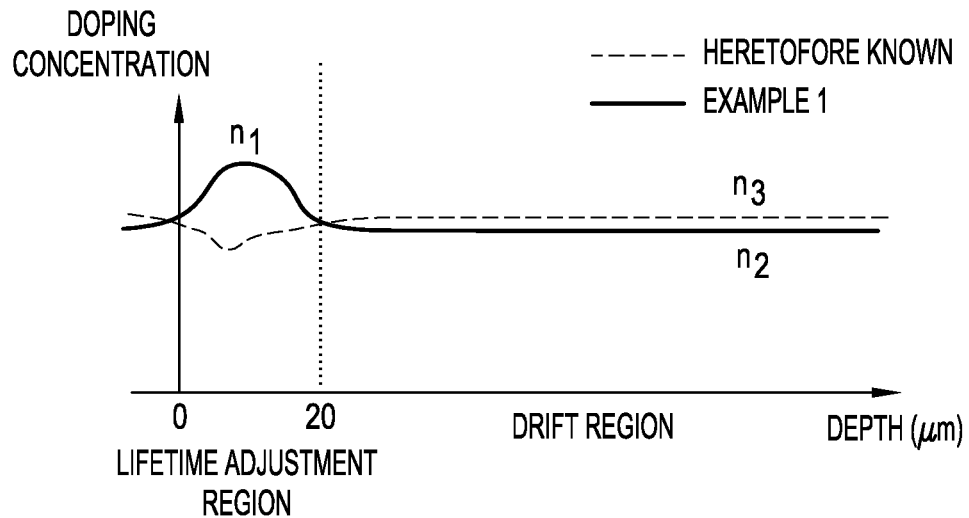
FIGS. 2A and 2B are characteristic diagrams showing a doping concentration profile and a lifetime profile of the reverse blocking IGBT of FIG. 1.
Figure 2B:
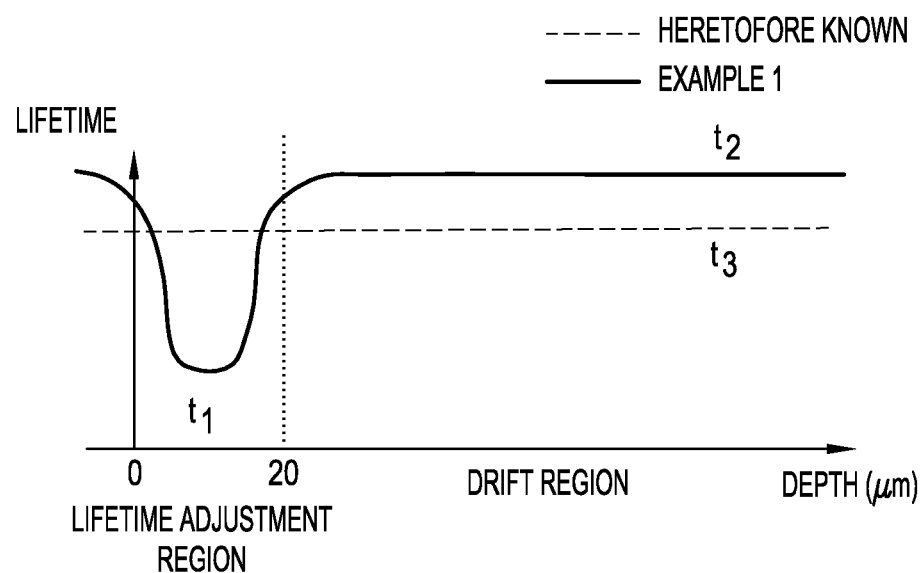
Figure 12:
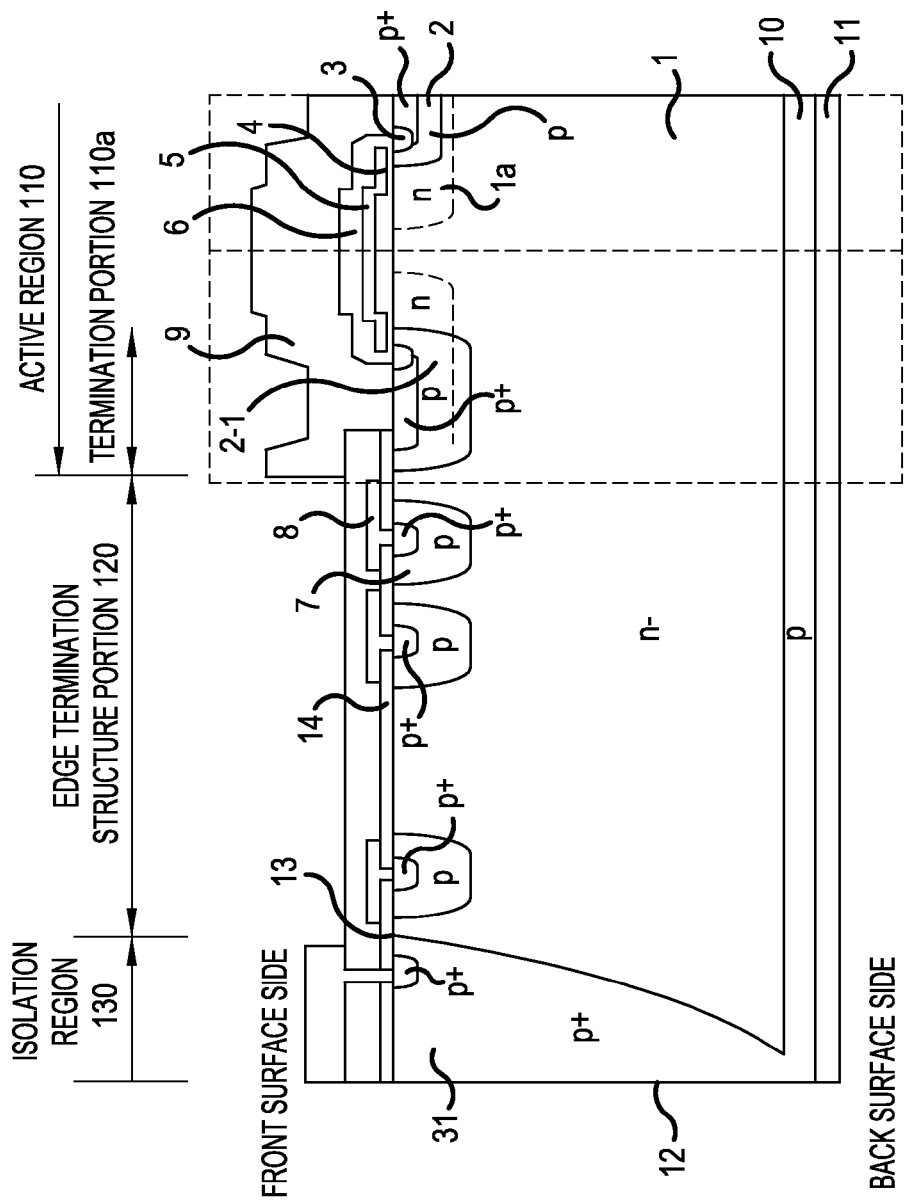
FIG. 12 is a sectional view showing a main portion of a heretofore known reverse blocking IGBT.
Figure 13:
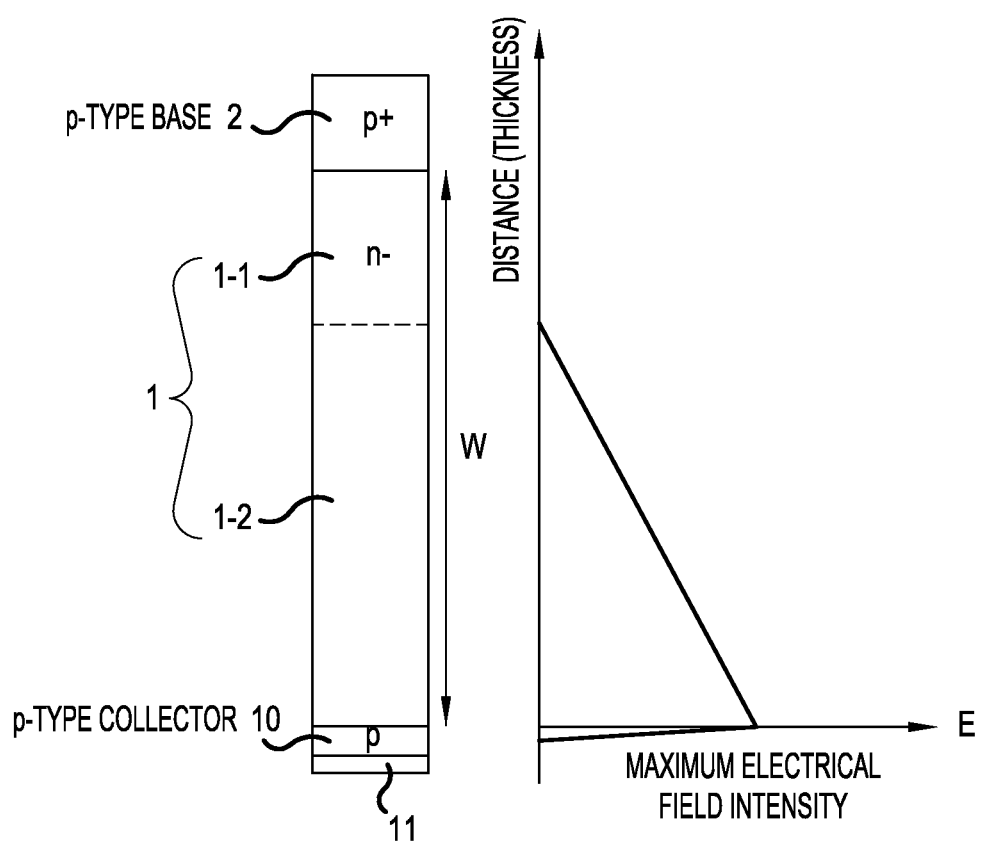
FIG. 13 is an illustration showing a main portion sectional structure, and an electric field intensity profile when reverse direction voltage is applied, of a heretofore known reverse blocking IGBT.
Figure 14:
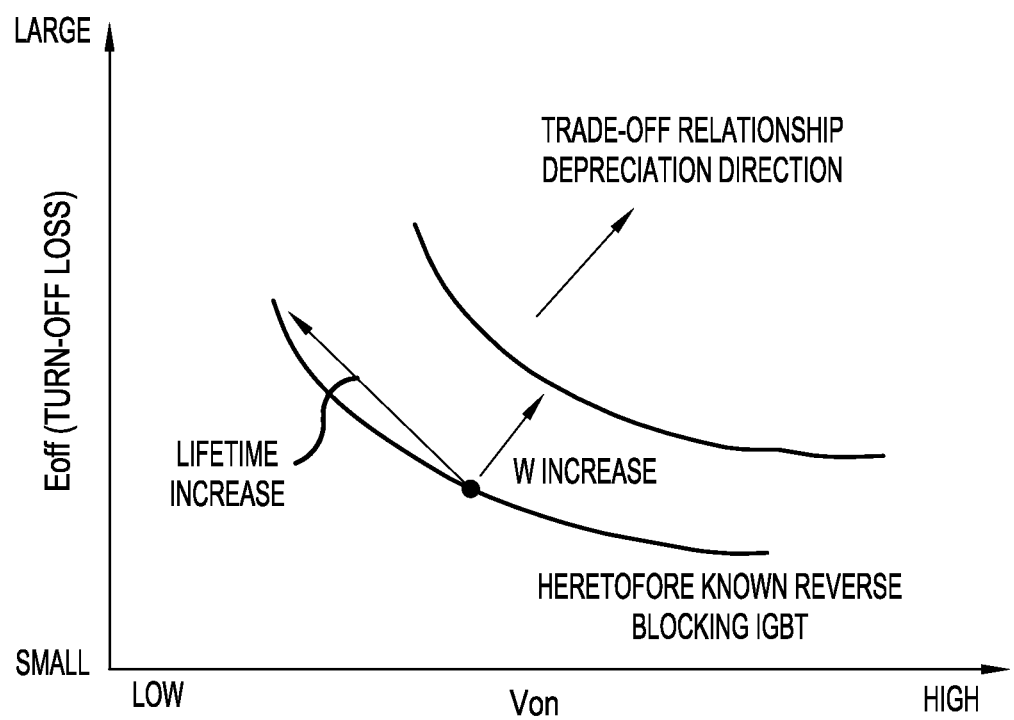
FIG. 14 is a characteristic diagram showing a trade-off relationship between Eoff and Von of a heretofore known reverse blocking IGBT.
Figure 15A:
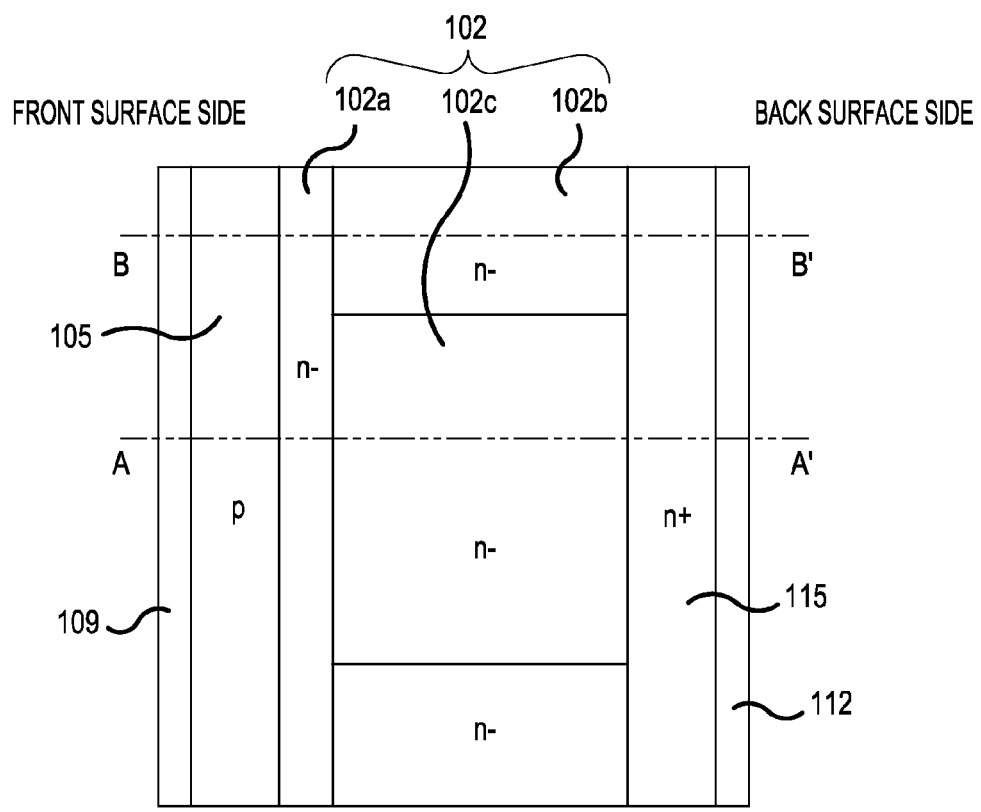
FIGS. 15A and 15B are illustrations showing a sectional structure and lifetime profile of a heretofore known diode.
Figure 15B:
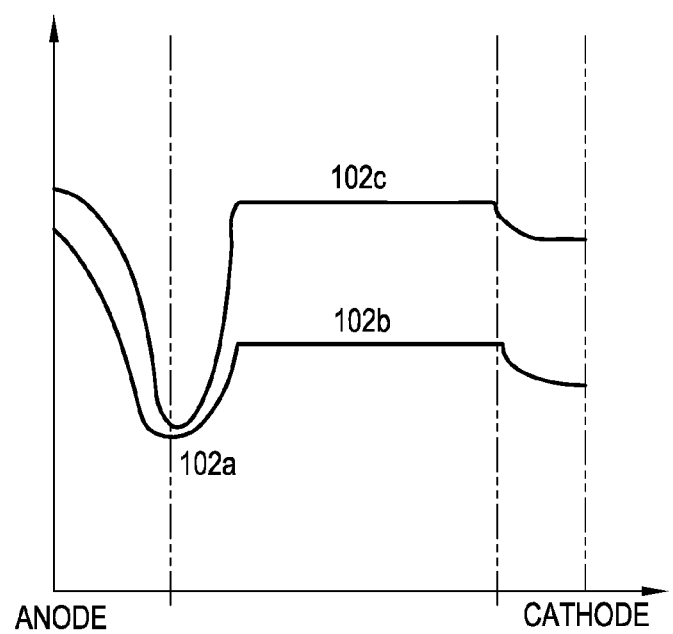
Figure 16:
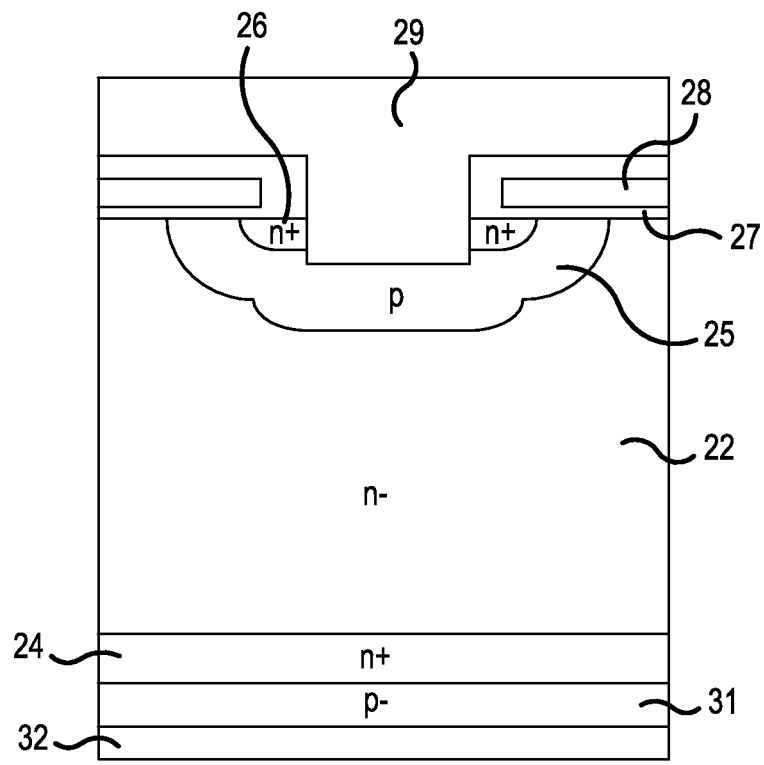
FIG. 16 is a sectional view showing a main portion of another example of a heretofore known IGBT.
Figure 17:
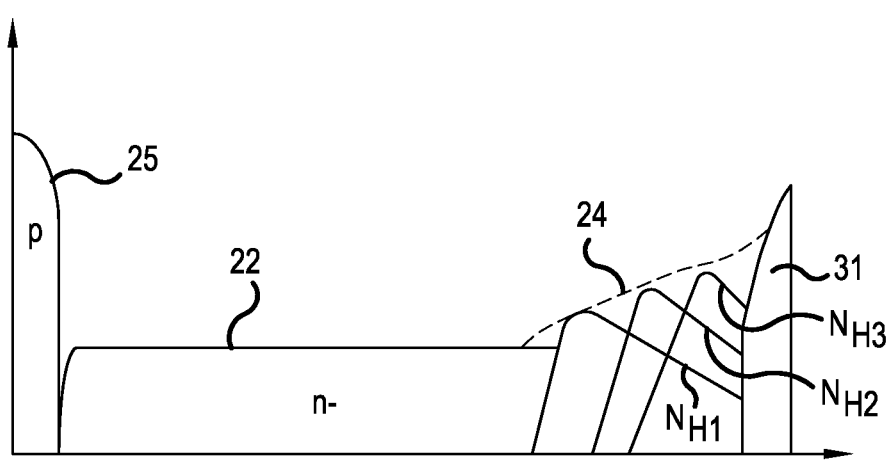
FIG. 17 is a doping profile diagram of the heretofore known IGBT of FIG. 16.

As heretofore described, the reverse blocking IGBT according to the invention shown in FIG. 1, when compared with the heretofore known reverse blocking IGBT shown in FIG. 12, is characterized by having a structure wherein the n-type low lifetime adjustment region 1b is additionally provided. The doping concentration profile of the n⁻ type drift region 1 and the n-type low lifetime adjustment region 1b, sandwiched by broken lines, of the reverse blocking IGBT of Example 1 is shown in FIG. 2(a). Also, the depth direction profile of the lifetime (hereafter referred to as the lifetime profile) of the reverse blocking IGBT of Example 1 is shown in FIG. 2(b). Also, the doping concentration profile and lifetime profile of the heretofore known reverse blocking IGBT are shown in FIG. 2(a) and FIG. 2(b) respectively.

In FIG. 2, the coordinate origin of the substrate depth direction distance, which forms the horizontal axis, is taken to be the bottom surface of the termination p-type base region 2-1 in the termination portion 110a of the active region 110, or of the p-type guard ring 7 of the edge termination structure portion 120. The vertical axis of FIG. 2(a) is the doping concentration, while the vertical axis of FIG. 2(b) is the lifetime.

In the reverse blocking IGBT of Example 1, a doping concentration $n_2$ of the n⁻ type drift region 1 in a portion deeper from the substrate front surface than the n-type low lifetime adjustment region 1b (hereafter referred to simply as the n⁻ type drift region 1 doping concentration) is uniform. The doping of the n-type low lifetime adjustment region 1b is carried out by proton irradiation, and the n-type low lifetime adjustment region 1b has a doping concentration profile that peaks at a doping concentration $n_1$ higher than the doping concentration $n_2$ of the n⁻ type drift region 1. A case wherein the ratio of the doping concentration of the n-type low lifetime adjustment region 1b with respect to that of the n⁻ type drift region 1 (the n-type low lifetime adjustment region 1b doping concentration $n_1$/the n⁻ type drift region 1 doping concentration $n_2$) is $n_1/n_2=1.0$ will be described in Example 2, to be described hereafter. Meanwhile, a doping concentration $n_3$ of the whole of the n⁻ type drift region 1 of the heretofore known reverse blocking IGBT indicated by the broken line in FIG. 2(a) has a concentration profile that is a little low in a depressed form on the substrate front surface side, due to the effect of an oxygen donor or an electron irradiation, but exhibits a doping concentration profile that is practically uniform in the depth direction.

With regard to lifetime, the heretofore known reverse blocking IGBT is such that a lifetime $t_3$ of the whole of the n⁻ type drift region 1 is controlled to be uniform in the depth direction, as shown in FIG. 2(b). Meanwhile, the reverse blocking IGBT of Example 1 is such that a localized proton irradiation, or combination of proton irradiation and electron irradiation, is carried out inside the n-type low lifetime adjustment region 1b, whereby a lifetime $t_1$ of the n-type low lifetime adjustment region 1b is adjusted to be shorter than a lifetime $t_2$ of the n⁻ type drift region 1. The lifetime $t_2$ of the n⁻ type drift region 1 of the reverse blocking IGBT of Example 1 is longer than the lifetime $t_3$ of the whole of the n⁻ type drift region 1 of the heretofore known reverse blocking IGBT. That is, with regard to the n-type low lifetime adjustment region 1b lifetime $t_1$ and n⁻ type drift region 1 lifetime $t_2$ of the reverse blocking IGBT of Example 1, taking $t_2 > t_3$ and $t_1 < t_3$ with respect to the lifetime $t_3$ of the whole of the n⁻ type drift region 1 of the heretofore known reverse blocking IGBT, $t_2$ is taken to be in a range of 0.2 μs to 3.0 μs, and $t_2/t_1$ is verified as being 2 to 8. Also, when $t_3/t_1 < 6$, it is taken that $t_2/t_1 > 6$. In each of FIG. 3 to FIG. 7, as well as the verification results of the reverse blocking IGBT of Example 1, the results of the heretofore known reverse blocking IGBT are shown as a comparison.

Figure 3:
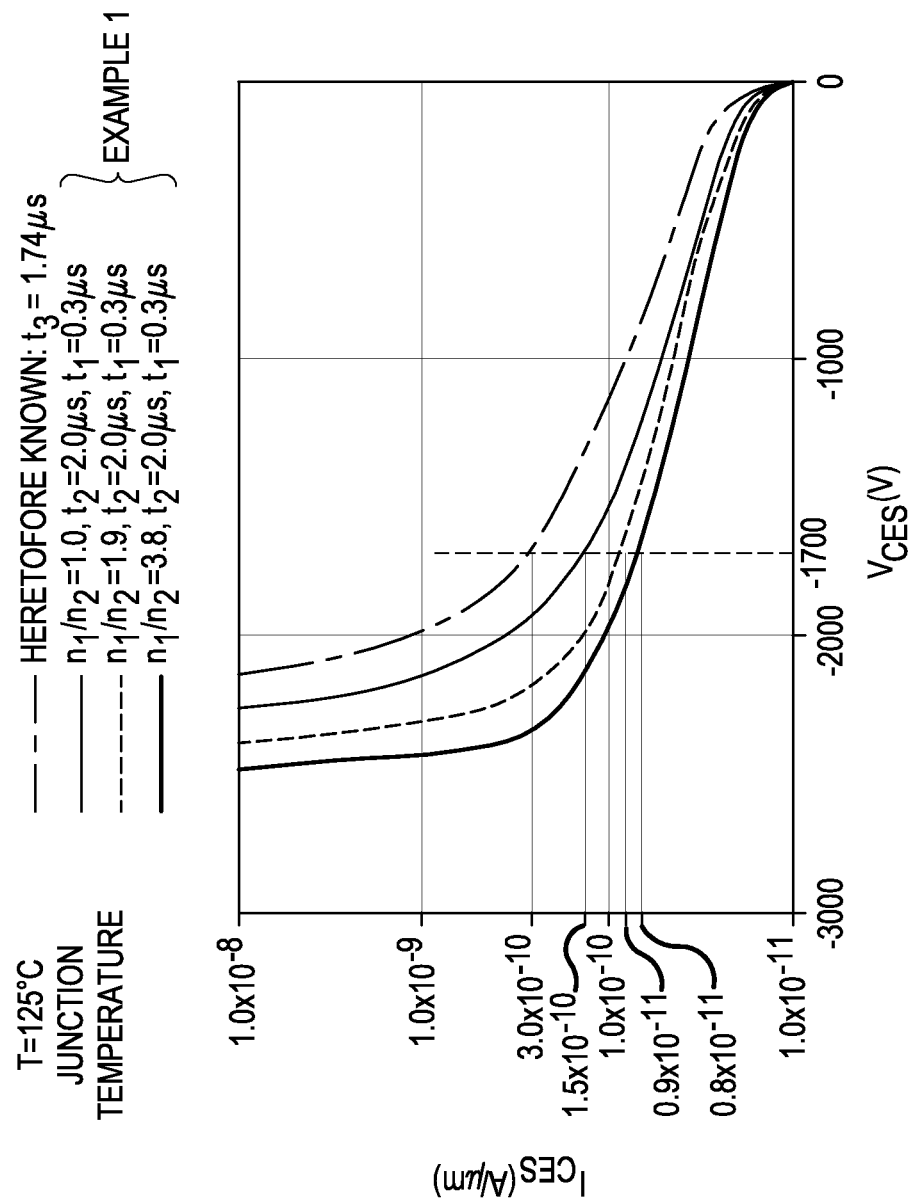
FIG. 3 is a characteristic diagram showing reverse direction current-voltage characteristics when a junction temperature T of the reverse blocking IGBT according to the invention is 125° C.

FIG. 3 is a characteristic diagram showing reverse direction current-voltage characteristics when a junction temperature T of the reverse blocking IGBT according to the invention is 125° C. FIG. 3 shows simulated reverse direction (the emitter electrode 9 is connected to a positive electrode while a collector electrode 11 is connected to a negative electrode) current-voltage characteristic curves for indicating (high temperature) reverse leakage current of the termination portion 110a or a gate pad portion of the active region 110 of a reverse blocking IGBT with a rated breakdown voltage of 1,700V. Note that the junction temperature T is 125° C., and a gate voltage $V_{GE}$ is 0V. FIG. 3 shows the reverse leakage current of the reverse blocking IGBT of Example 1 and the heretofore known reverse blocking IGBT when an emitter-collector reverse direction voltage $V_{CES}$ is −1,700V. As shown in FIG. 3, the reverse leakage current of the heretofore known reverse blocking IGBT (the lifetime $t_3$ of the whole of the n⁻ type drift region 1 is adjusted to be 1.74 μs) is $3.0 \times 10^{-10}$ A/μm. As opposed to this, when the ratio of the doping concentration of the n-type low lifetime adjustment region 1b with respect to that of the n⁻ type drift region 1 is $n_1/n_2=3.8$ and $n_1/n_2=1.9$ in the reverse blocking IGBT of Example 1, it is shown that the reverse leakage current is reduced to $0.8 \times 10^{-11}$ A/μm and $0.9 \times 10^{-11}$ A/μm respectively. In the following description, descriptions relating to reverse leakage current refer to a high temperature reverse leakage current. A high temperature reverse leakage current is a reverse leakage current when the operating temperature range is at a high temperature, such that the junction temperature T reaches in the region of, for example, 125° C. Also, even when the ratio of the doping concentration of the n-type low lifetime adjustment region 1b with respect to that of the n⁻ type drift region 1 is $n_1/n_2=1.0$, the 0.3 lifetime $t_1$ of the n-type low lifetime adjustment region 1b is short and works effectively, and the reverse leakage current of the reverse blocking IGBT of Example 1 is reduced to $1.5 \times 10^{-10}$ A/μm, approximately one-half of that heretofore known. In the reverse blocking IGBT of Example 1, the lifetime $t_2$ of the n⁻ type drift region 1 and the lifetime $t_1$ of the n-type low lifetime adjustment region 1b are taken to be $t_2=2.0$ μs, and $t_1=0.3$ μs.

Figure 4:
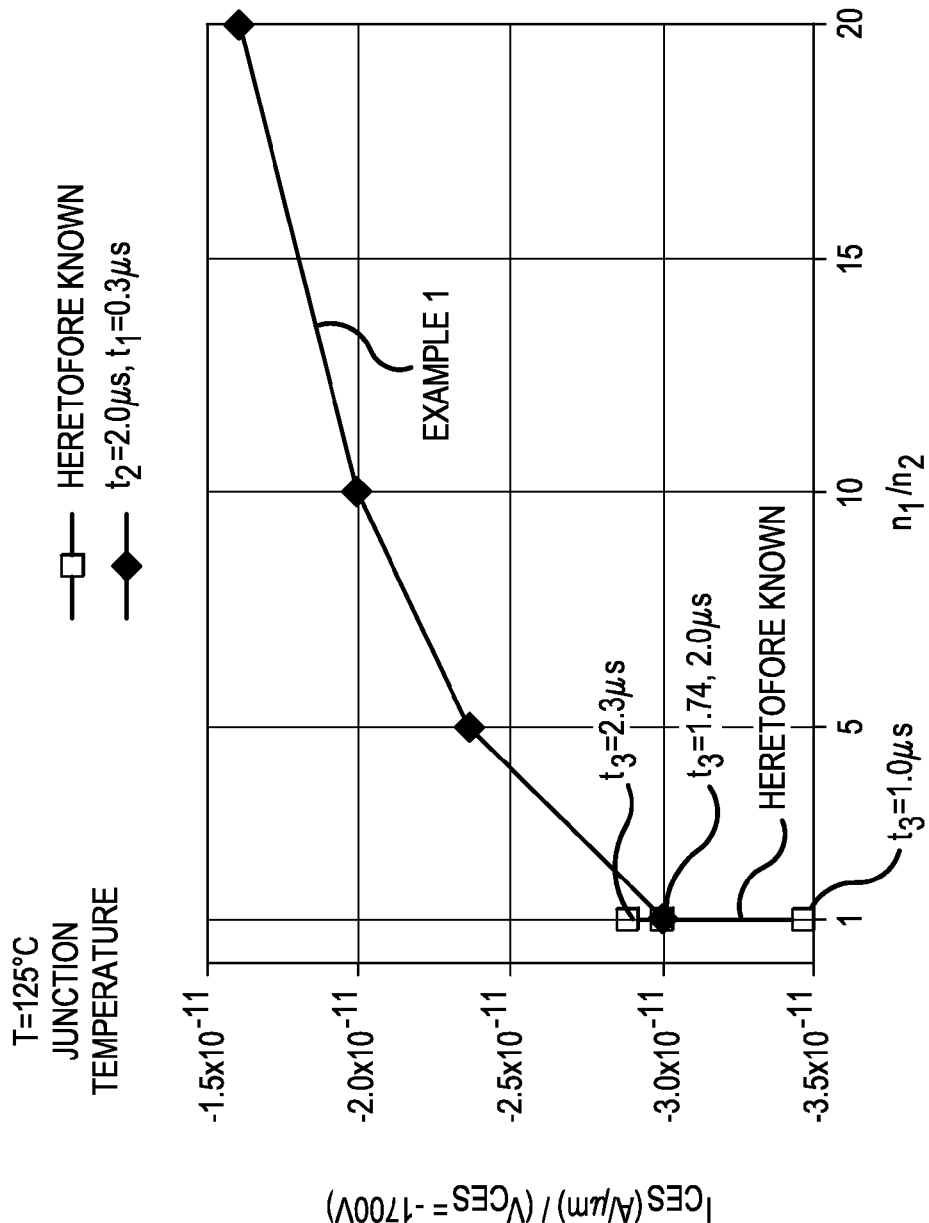
FIG. 4 is a characteristic diagram showing the relationship between a doping concentration ratio and a reverse leakage current when the junction temperature T of the reverse blocking IGBT according to the invention is 125° C.

FIG. 4 is a characteristic diagram showing the relationship between doping concentration ratio and reverse leakage current when the junction temperature T of the reverse blocking IGBT according to the invention is 125° C. FIG. 4 shows the relationship between the reverse leakage current when the emitter-collector reverse direction voltage $V_{CES}$ in a single cell in the active region of a reverse blocking IGBT with a rated breakdown voltage of 1,700V is −1,700V and the ratio $n_1/n_2$ of the doping concentration of the n-type low lifetime adjustment region 1b with respect to that of the n⁻ type drift region 1. The junction temperature T is 125° C., the gate voltage $V_{GE}$ is 0V, and the lifetime $t_2$ of the n⁻ type drift region 1 and lifetime $t_1$ of the n-type low lifetime adjustment region 1b of the reverse blocking IGBT of Example 1 are such that $t_2=2.0$ μs and $t_1=0.3$ μs, the same as the verification results shown in FIG. 3. For the sake of comparison, the reverse leakage current of the heretofore known reverse blocking IGBT is also shown. The lifetime $t_3$ of the whole of the n⁻ type drift region 1 at each data point (square) of the heretofore known reverse blocking IGBT is such that $t_3=1.0$ μs, 1.74 μs, 2.0 μs, and 2.3 μs in the direction of increase. The heretofore known reverse blocking IGBT is such that, even when a high value such as 2.3 μs is adopted for the lifetime $t_3$ of the whole of the n⁻ type drift region 1, the reverse leakage current does not drop below $2.8 \times 10^{-11}$ A/μm.

Figure 5:
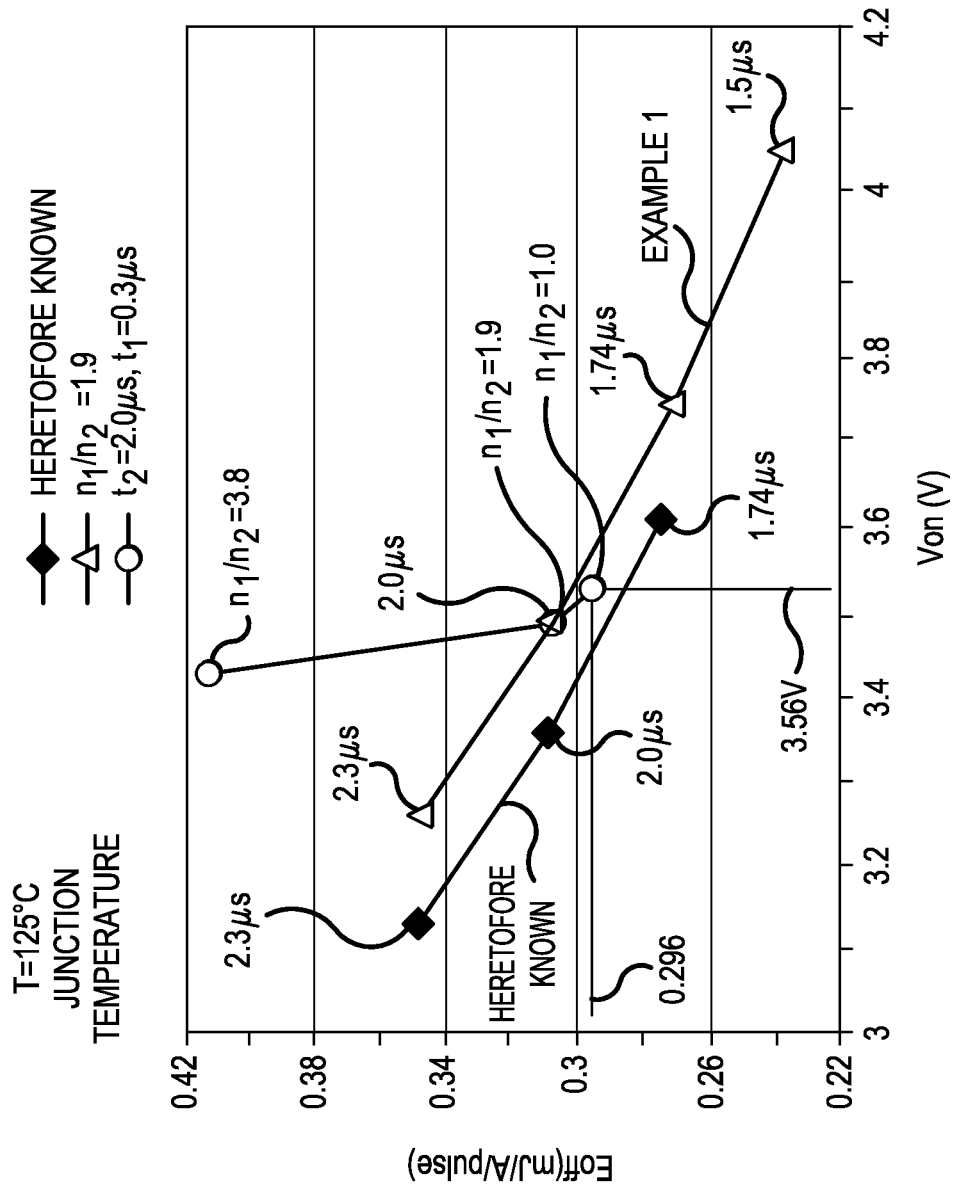
FIG. 5 is a characteristic diagram showing the relationship between a turn-off loss Eoff and an on-state voltage Von of the reverse blocking IGBT according to the invention.

Meanwhile, in the case of the reverse blocking IGBT of Example 1 (diamond), it is shown that the bigger the ratio $n_1/n_2$ of the doping concentration of the n-type low lifetime adjustment region 1b with respect to that of the n⁻ type drift region 1, the smaller the reverse leakage current. For example, it is seen that the reverse leakage current ($2.0 \times 10^{-11}$ A/μm) of the reverse blocking IGBT of Example 1 when the ratio $n_1/n_2$ of the doping concentration of the n-type low lifetime adjustment region 1b with respect to that of the n⁻ type drift region 1 is 10 decreases to approximately two-thirds with respect to the reverse leakage current ($3.0 \times 10^{-11}$ A/μm) when the lifetime $t_3$ of the whole of the n⁻ type drift region 1 of the heretofore known reverse blocking IGBT is 1.74 μs. However, the ratio $n_1/n_2$ of the doping concentration of the n-type low lifetime adjustment region 1b with respect to that of the n⁻ type drift region 1 increases beyond 3.8, and turn-off loss (Eoff) further increases beyond 0.41 (mJ/A/pulse), as shown in FIG. 5. Consequently, it is preferable that the ratio $n_1/n_2$ of the doping concentration of the n-type low lifetime adjustment region 1b with respect to that of the n⁻ type drift region 1 of the reverse blocking IGBT of the invention is less than 4.

FIG. 5 is a characteristic diagram showing the relationship between the turn-off loss Eoff and the on-state voltage Von of the reverse blocking IGBT according to the invention. FIG. 5 shows a trade-off relationship between the turn-off loss Eoff and the on-state voltage Von of the reverse blocking IGBT of Example 1 and of the heretofore known reverse blocking IGBT. In FIG. 5, the collector implantation conditions of the reverse blocking IGBT of Example 1 and of the heretofore known reverse blocking IGBT are constant. In FIG. 5, the heretofore known reverse blocking IGBT is such that the lifetime $t_3$ of the whole of the n⁻ type drift region 1 changes. The reverse blocking IGBT of Example 1 is obtained by fixing the lifetime $t_1$ of the n-type low lifetime adjustment region 1b at 0.3 μs, and changing the lifetime $t_2$ of the n⁻ type drift region 1. Specifically, the lifetime $t_3$ of the whole of the n⁻ type drift region 1 of the heretofore known reverse blocking IGBT is such that $t_3=2.3$ μs, 2.0 μs, and 1.74 μs respectively at the data points (diamonds) in a direction from the top left toward the bottom right of the curve. In the case of the reverse blocking IGBT of Example 1, the lifetime $t_2$ of the n⁻ type drift region 1 at each data point (triangle) is such that $t_2=2.3$ μs, 2.0 μs, 1.74 μs, and 1.5 μs respectively in a direction from the top left toward the bottom right of the curve. For the reverse blocking IGBT of Example 1, there is also shown the trajectory (circles) of the turn-off loss Eoff and on-state voltage Von (hereafter referred to as (Eoff, Von)) when the ratio $n_1/n_2$ of the doping concentration of the n-type low lifetime adjustment region 1b with respect to that of the n⁻ type drift region 1 varies in a range of 1 to 3.8 when the lifetime $t_2$ of the n⁻ type drift region 1 is 2.0 μs.

From the results shown in FIG. 5, when the heretofore known reverse blocking IGBT is used at (Eoff, Von)=(0.275 mJ/A/pulse, 3.61V), the reverse blocking IGBT of Example 1 is such that (Eoff, Von)=(0.307 mJ/A/pulse, 3.49V), showing that the trade-off relationship between the turn-off loss Eoff and the on-state voltage Von (Eoff–Von) deteriorates somewhat. However, when it is necessary to reduce the reverse leakage current of the heretofore known reverse blocking IGBT to, for example, one-1.5th (1/1.5) or less, it is necessary to increase the (Eoff, Von) of the heretofore known reverse blocking IGBT further than when the lifetime $t_3$ of the whole of the n⁻ type drift region 1 is 2.3 μs, as illustrated in FIG. 4. That is, further increasing the 2.3 μs lifetime $t_3$ of the whole of the n⁻ type drift region 1 in the heretofore known reverse blocking IGBT means that a data point is added further to the top left than the $t_3=2.3$ μs data point of FIG. 5, which deviates considerably from the original conditions of use, and is unusable in practice. Consequently, from an aspect of balancing the relationship between the reverse leakage current and (Eoff–Von), the reverse blocking IGBT of the invention having the n-type low lifetime adjustment region 1b is more desirable than the heretofore known reverse blocking IGBT, even though the trade-off relationship between the turn-off loss Eoff and the on-state voltage Von deteriorates somewhat, as previously described.

Figure 6:
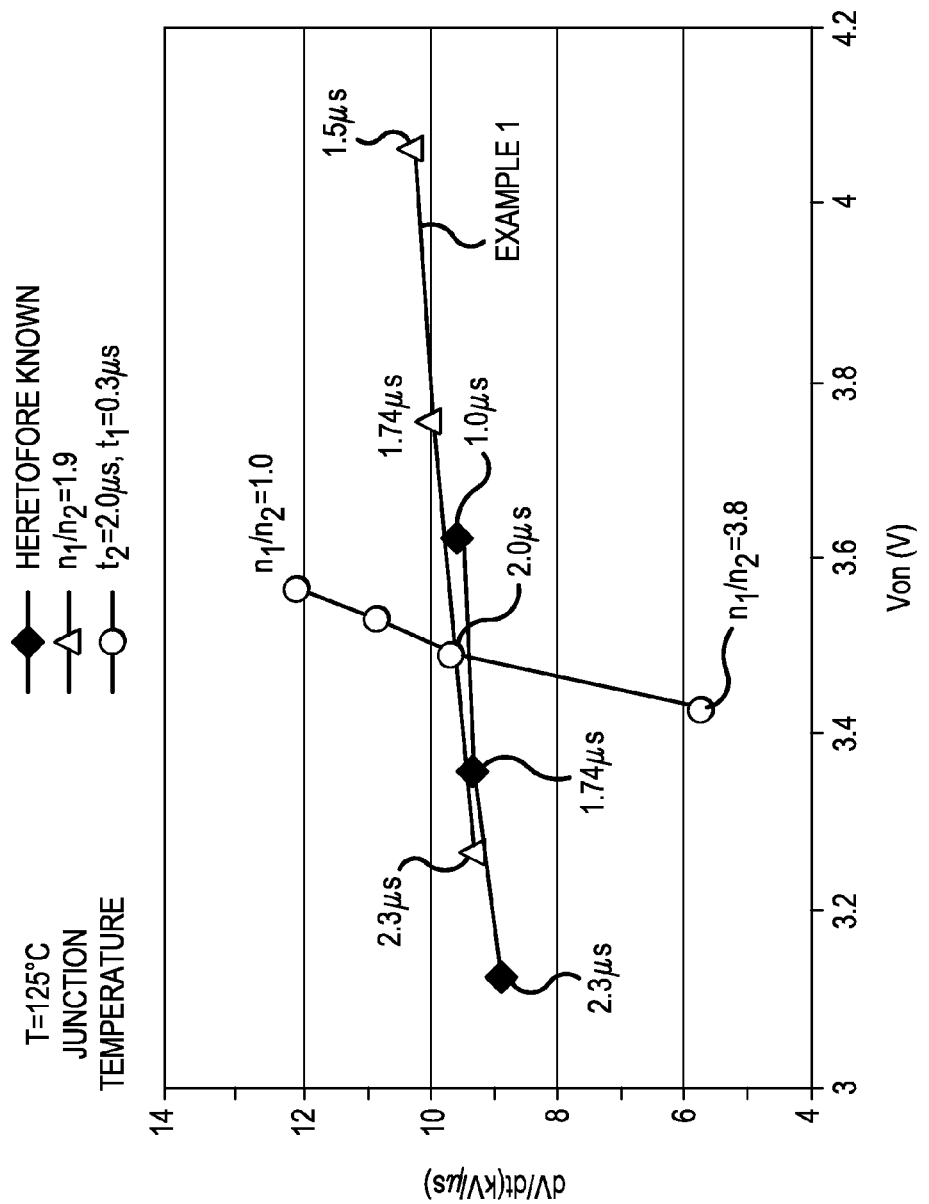
FIG. 6 is a characteristic drawing showing the relationship between dV/dt and the on-state voltage Von when turning off the reverse blocking IGBT according to the invention.

The heretofore described turn-off loss Eoff is a value obtained by a switching speed $d(V_{CE})/dt$ being practically the same. The relationship between dV/dt and Von corresponding to each data point of FIG. 5 is shown in FIG. 6. FIG. 6 is a characteristic figure showing the relationship between dV/dt and the on-state voltage Von when turning off the reverse blocking IGBT according to the invention. The bus voltage of a switching off test circuit is 850V. The parasitic inductance is 300 nH. A turn-off gate resistance Rg of the heretofore known reverse blocking IGBT is 34Ω, and the turn-off gate resistance Rg of the reverse blocking IGBT of Example 1 is 18Ω. From the results shown in FIG. 6, it can be seen that, by adjusting an $n_1/n_2$ concentration ratio, lifetime ratio, and gate drive resistance value as appropriate for the device of this example, it is possible for the switching speed (dV/dt) to be practically the same as that of the heretofore known reverse element IGBT.

Figure 7:
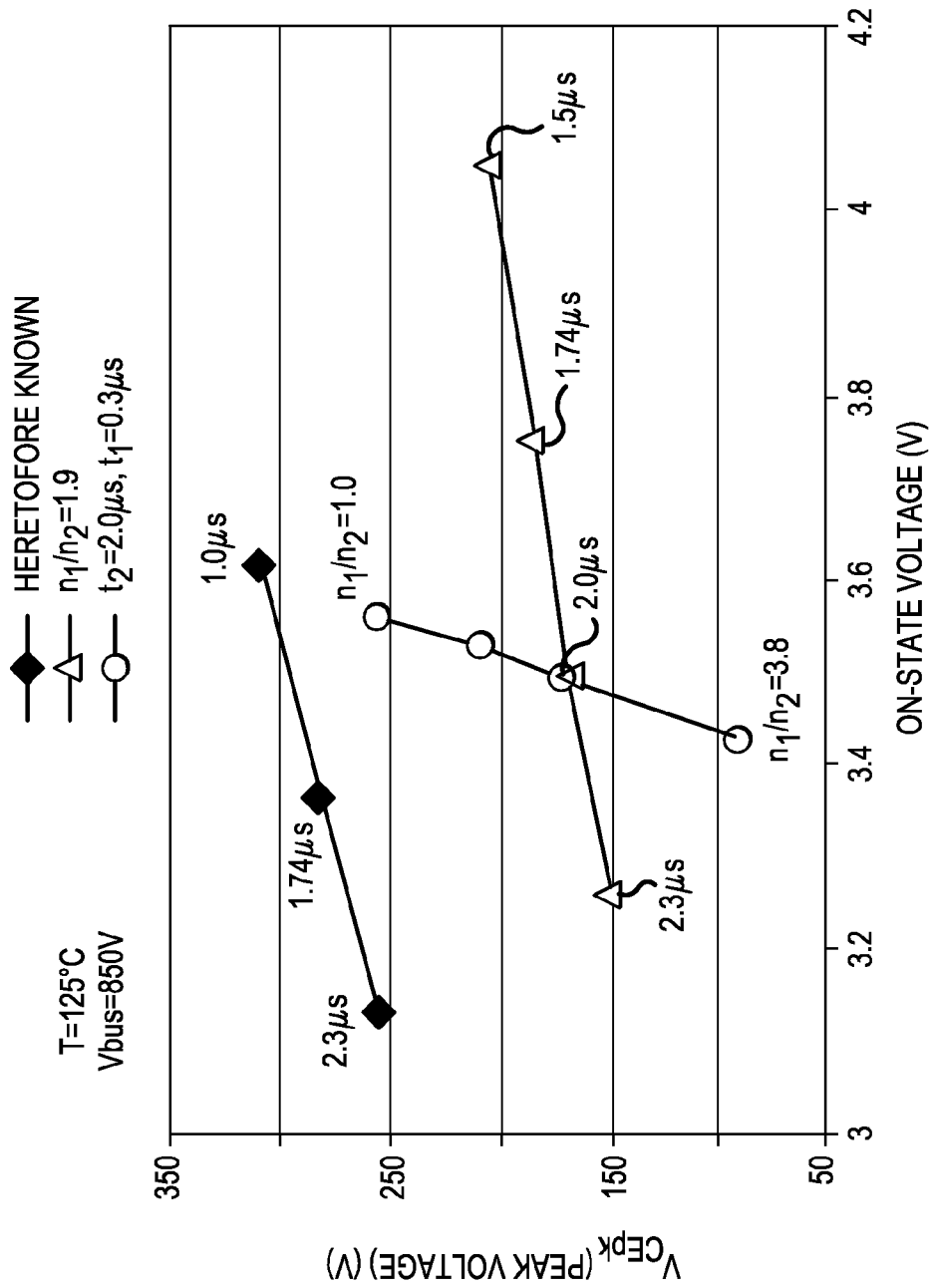
FIG. 7 is a characteristic diagram showing the relationship between the collector voltage peak spiking during turning off the reverse blocking IGBT according to the invention and the on-state voltage Von.

A collector voltage peak spiking $V_{CEpk}=(V_{CEpk}-850V)$ corresponding to each data point of FIG. 5 is shown in FIG. 7. FIG. 7 is a characteristic figure showing the relationship between the collector voltage peak spiking when turning off the reverse blocking IGBT according to the invention and the on-state voltage Von. From the results shown in FIG. 7, it can be seen that the peak spiking $V_{CEpk}$ of the collector voltage when turning off the reverse blocking IGBT of Example 1 (triangles) is approximately nearly half of that of the heretofore known reverse blocking IGBT (diamonds). Consequently, it is clear that the reverse blocking IGBT of Example 1 has greater ruggedness to overvoltage than the heretofore known reverse blocking IGBT.

Figure 8:
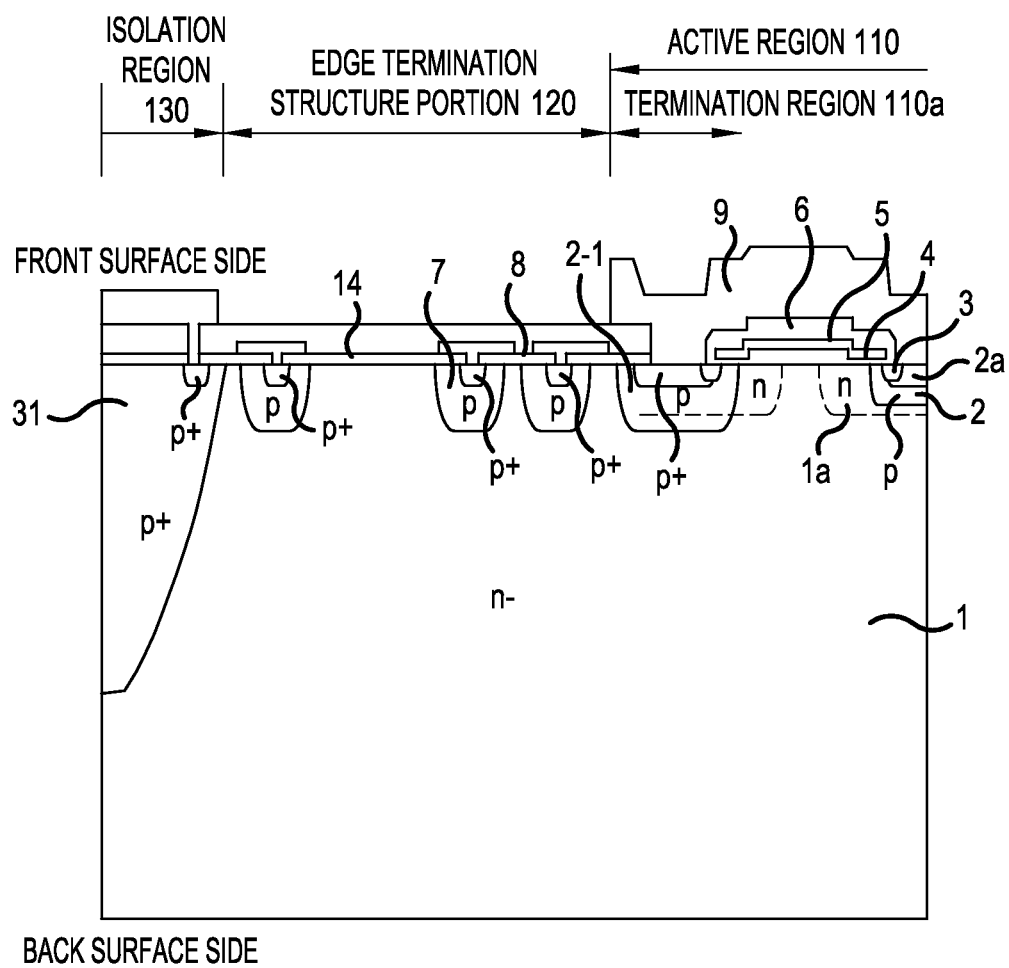
FIG. 8 is a first sectional view showing a state partway through the manufacture of the reverse blocking IGBT according to Example 1 of the invention.
Figure 9:
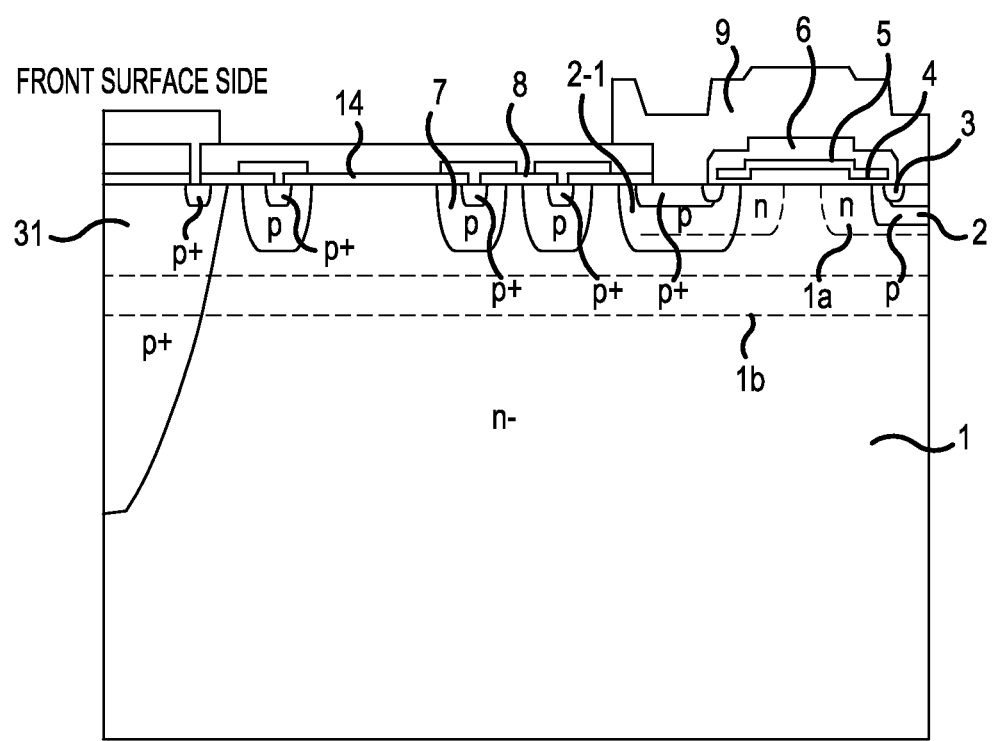
FIG. 9 is a second sectional view showing a state partway through the manufacture of the reverse blocking IGBT according to Example 1 of the invention.
Figure 10:
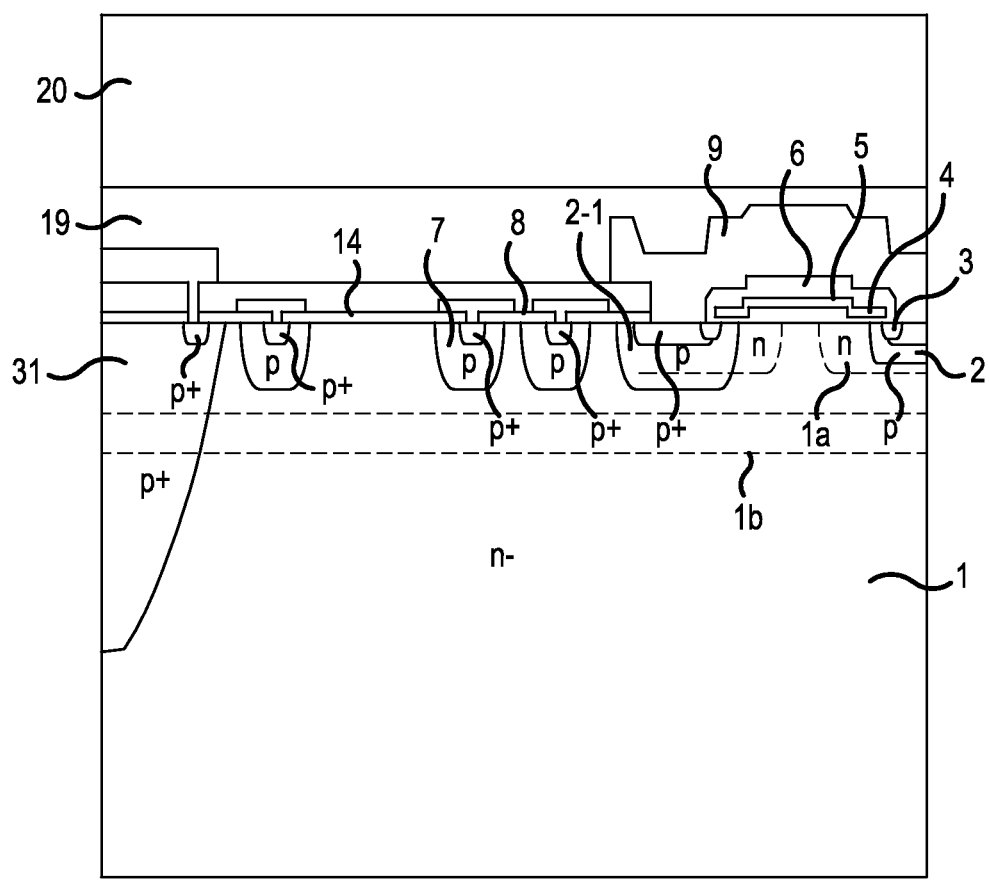
FIG. 10 is a third sectional view showing a state partway through the manufacture of the reverse blocking IGBT according to Example 1 of the invention.

Next, a description will be given hereafter of a method of manufacturing a reverse blocking IGBT, including the formation of the n-type low lifetime adjustment region 1b in, for example, Example 1. FIG. 8 to FIG. 10 are sectional views showing states partway through the manufacture of the reverse blocking IGBT according to Example 1 of the invention. Firstly, using the same method as for the heretofore known reverse blocking IGBT, the isolation region 130 including the $p^+$ type isolation layer 31 and the substrate front surface side surface structure including a MOS gate (an isolated gate formed of a metal, an oxide, and a semiconductor) structure of the active region 110 and the edge termination structure portion 120 are formed on a wafer ($n^-$ type semiconductor substrate) that forms the $n^-$ type drift region 1, as shown in FIG. 8. Next, although not shown, a polyimide film or nitride film layer is further deposited as a passivation layer over the whole of the front surface of the wafer, and the passivation layer is selectively etched so that aluminum wire bonding is possible, thereby forming bonding pad regions by exposing metal electrode surfaces forming an emitter electrode pad and a gate electrode pad.

The MOS gate structure of the reverse blocking IGBT is formed of the p-type base region 2, the $n^+$ type emitter region 3, the gate dielectric 4, and the gate electrode 5. The surface of the gate electrode 5, which is formed of polysilicon, is covered by the emitter electrode 9 over the interlayer dielectric 6. The emitter electrode 9 forms an ohmic contact with the $n^+$ type emitter region 3 provided inside the p-type base region 2 and with the surface of a $p^+$ type contact region 2a. It is preferable that an n-type high concentration region 1a is provided to a depth greater than that of the p-type base region 2, but not reaching the n-type low lifetime adjustment region 1b, in a surface layer of the $n^-$ type drift region 1 between neighboring p-type base regions 2, as this can also reduce the on-state voltage. It is preferable that the depth of the termination p-type base region 2-1 of the termination portion 110a in the active region 110 is greater than the depth of the p-type base region 2 inward of the termination p-type base region 2-1. The reason for this is that, by the depth of the termination p-type base region 2-1 being greater in this way, the resistance of the termination p-type base region 2-1 decreases, because of which the hole carriers of the termination portion are more easily discharged during turn-off reverse recovery, and it is thus possible to increase turn-off ruggedness (RBSOA). Also, for example, the termination p-type base region 2-1 of the termination portion 110a being of the same depth as the p-type guard ring 7 in the edge termination structure portion 120 is preferable from the aspect of process efficiency, as the termination p-type base region 2-1 and p-type guard ring 7 can be formed in the same process step.

By including the p-type guard ring 7 and a field plate 8 in the edge termination structure portion 120, it is possible to relax the electrical field intensity in the edge termination structure portion 120 when a blocking voltage is applied, and thus possible to enhance the reliability of the edge termination structure. The $p^+$ type isolation layer 31 is formed so as to penetrate, for example, the $n^-$ type semiconductor substrate in the depth direction by a thermal diffusion of an impurity (boron or the like) from one main surface of the $n^-$ type semiconductor substrate. The $p^+$ type isolation layer 31 is connected to a p-type collector region 10 formed in a subsequent step, and owing to the $p^+$ type isolation layer 31, the structure is such that the termination of a p-n junction between the p-type collector region 10 and the $n^-$ type drift region 1, which is a reverse direction voltage withstanding junction, is not exposed on the chip side end surface that forms the cutting plane when fabricating chips. Also, owing to the $p^+$ type isolation layer 31, the p-n junction between the p-type collector region 10 and the $n^-$ type drift region 1 is exposed on the substrate surface (substrate front-side surface) of the edge termination structure portion 120 protected by a dielectric 14. Because of this, it is possible to increase reverse direction voltage withstanding reliability.

Next, the energy of proton irradiation is selected in accordance with the wafer thickness, and a proton dose in a range of, for example, $5.0 \times 10^{13}$ cm$^{-2}$ to $5.0 \times 10^{14}$ cm$^{-2}$ is implanted from the back surface of the wafer, as shown in FIG. 9. Next, thermal annealing is carried out for, for example, 30 minutes to 60 minutes in a hydrogen atmosphere at a temperature of, for example, 330° C. to 380° C., forming the n-type low lifetime adjustment region 1b inside the $n^-$ type drift region 1 in the vicinity of the bottom surfaces of the p-type guard ring 7 and the termination p-type base region 2-1.

Next, a photoresist 19 is applied to the surface structure (wafer front surface side device structure) of the reverse blocking IGBT, and after photoresist curing, a back grinding (BG) tape 20 is attached onto the photoresist 19 in order to grind the wafer back surface, as shown in FIG. 10. Next, the wafer back surface is ground so that the wafer thickness becomes approximately 300 μm, and polished by touch polishing using a CMP (Chemical and Mechanical Polishing) grinding apparatus or the like. Next, the BG tape 20 is removed, and the wafer is cleaned. Next, a region of 5 μm to 20 μm of the silicon surface on the back surface side of the wafer is removed by wet etching, forming a finished surface. Next, an ion implantation for forming the p-type collector region 10 on the wafer back surface is carried out, after which the p-type collector region 10 is formed by activating using laser annealing or the like. Next, the photoresist 19 on the wafer front surface side is removed. Subsequently, the collector electrode 11 is formed by electrode metal being sputtered and metal annealing being performed, thus completing the wafer process. By so doing, the reverse blocking IGBT shown in FIG. 1 is completed.

Example 2

Next, a description will be given of a reverse blocking IGBT of Example 2. The reverse blocking IGBT in FIG. 2 wherein the doping profile is the same as that of the heretofore known reverse blocking IGBT and only the lifetime profile differs, that is, the reverse blocking IGBT wherein the ratio of the doping concentration of the n-type low lifetime adjustment region 1b with respect to that of the n⁻ type drift region 1 is such that $n_1/n_2=1$, is taken as Example 2. The heretofore known reverse blocking IGBT used for comparison has the turn-off loss Eoff and the on-state voltage Von such that (Eoff, Von)=(0.275 mJ/A/pulse, 3.61V), and the doping concentration of the whole of the n⁻ type drift region 1 is such that $t_3=1.74$ μs.

When the lifetime $t_2$ of the n⁻ type drift region 1 and the lifetime $t_1$ of the n-type low lifetime adjustment region 1b in the reverse blocking IGBT of Example 2 are such that $t_2=2.0$ μs and $t_1=0.3$ μs, it is seen from FIG. 4 that the reduction in the high temperature reverse leakage current of the active region 110 is smaller than in the heretofore known reverse blocking IGBT, but it is shown in FIG. 3 that the reverse leakage current of the termination portion 110a is reduced by half (reduced by half to $1.5 \times 10^{-9}$ A/μm from $3.0 \times 10^{-9}$ A/μm, which is the reverse leakage current of the heretofore known reverse blocking IGBT). The reduction in reverse leakage current in the whole of the reverse blocking IGBT element is determined by the ratio between the areas of the active region 110 and termination portion 110a, including the gate pad portion. The reverse blocking IGBT of Example 2 is such that, although the same degree of reduction as in the reverse blocking IGBT of Example 1 cannot be expected, the high temperature reverse leakage in the whole of the reverse blocking IGBT device is reduced. At this time, from FIG. 5, the reverse blocking IGBT of Example 2 is such that (Eoff, Von)=(0.296 mJ/A/pulse, 3.56V). Also, as can be seen from FIG. 7, the collector voltage peak spiking $V_{CEpk}$ is approximately 310V when the lifetime $t_3$ of the whole of the n⁻ type drift region 1 of the heretofore known reverse blocking IGBT is 1.0 μs, while the collector voltage peak spiking $V_{CEpk}$ is 260V when the ratio of the doping concentration of the n-type low lifetime adjustment region 1b with respect to that of the n⁻ type drift region 1 of the reverse blocking IGBT of Example 2 is such that $n_1/n_2=1.0$, a reduction of approximately 50V.

Figure 11:
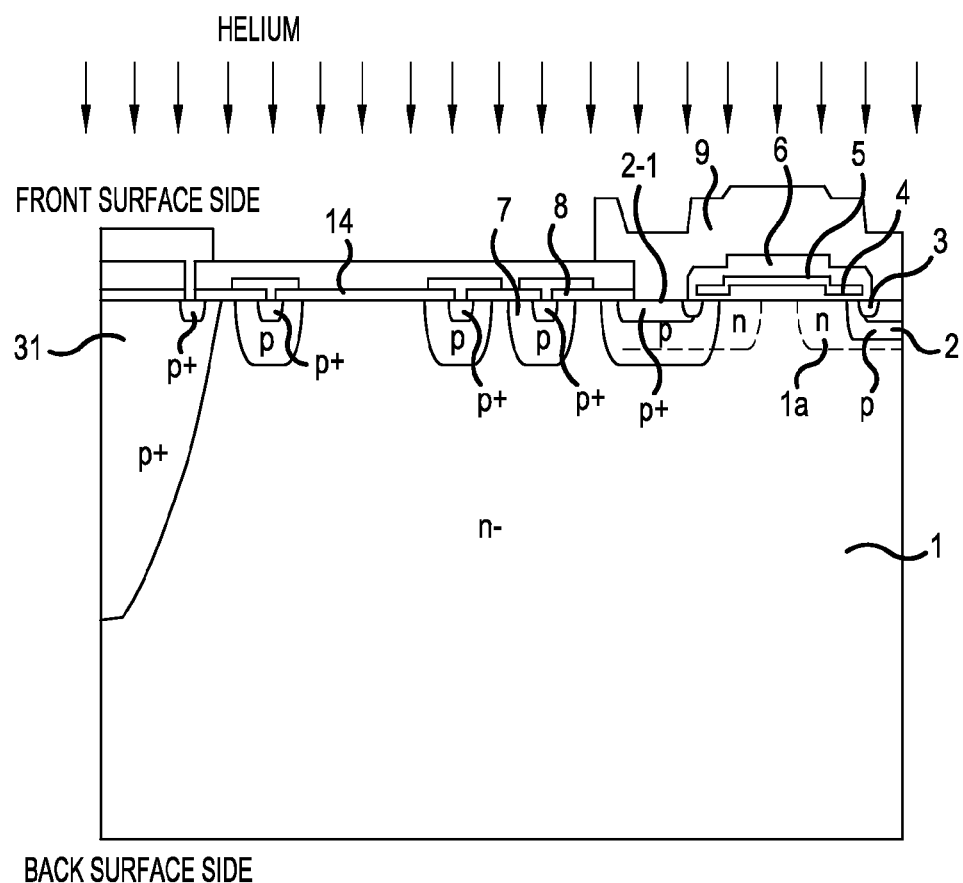
FIG. 11 is a sectional view showing a state partway through the manufacture of the reverse blocking IGBT according to Example 2 of the invention.

Next, a description will be given hereafter of a method of manufacturing a reverse blocking IGBT, including a method of forming the n-type low lifetime adjustment region 1b in, for example, Example 2. FIG. 11 is a sectional view showing a state partway through the manufacture of the reverse blocking IGBT according to Example 2 of the invention. Firstly, using the same method as in Example 1, the p⁺ type isolation layer 31 and the surface structure including the MOS gate structure of the active region 110 and the edge termination structure are formed on a wafer (n⁻ type semiconductor substrate) that forms the n⁻ type drift region 1. Next, in the same way as in Example 1, an unshown polyimide film or a nitride film layer is deposited as a passivation layer over the whole of the front surface of the wafer, and the passivation layer is etched so that aluminum wire bonding is possible, thereby forming bonding pad regions (not shown) by exposing metal electrode surfaces.

Next, in place of the proton irradiation of the manufacturing method of Example 1, a helium (He) ion implantation is carried out from the front surface side of the wafer, as shown in FIG. 11. It is preferable that the implantation energy is in a range of, for example, 2 MeV to 5.5 MeV. Also, an electron irradiation is also performed over the whole wafer. Subsequently, the n-type low lifetime adjustment region 1b is formed by thermal annealing being performed, for example, 60 minutes in a hydrogen atmosphere at a temperature of in the range of, for example, 380° C. or less, thus creating a state the same as that of the reverse blocking IGBT of Example 1 shown in FIG. 9.

Subsequently, creating a wafer having a desired thickness, and having a back surface on which a polishing process has been performed, via the process of FIG. 10, in the same way as in Example 1, an ion implantation for forming the p-type collector region 10 on the wafer back surface is carried out, after which the p-type collector region 10 is formed by activating using laser annealing or the like. Next, the photoresist 19 on the wafer front surface side is removed. Subsequently, the collector electrode 11 is formed on the wafer back surface by electrode metal being sputtered and metal annealing being performed, thus completing the wafer process. By so doing, the reverse blocking IGBT shown in FIG. 1 is completed.

As heretofore described, according to the invention, by providing an n-type low lifetime adjustment region, wherein the carrier lifetime is adjusted to be lower than in the n⁻ type drift region, in a portion deeper from the substrate front surface than the bottom surface of the termination p-type base region, it is possible to reduce the high temperature reverse leakage current and the collector voltage peak spiking during turn-off, with no extreme deterioration of the Eoff–Von trade-off relationship. Because of this, the operating temperature range is widened, or it is possible to reduce the heat sink capacity of an instrument in which mounted. Consequently, the application range of a matrix converter or a multilevel inverter in which a reverse blocking IGBT is mounted is widened owing to an increase in operating temperature or reduction in size, whereby the energy conversion efficiency of commercial or consumer instruments increases.

The invention not being limited to the heretofore described embodiment and examples, various changes are possible without departing from the scope of the invention.

INDUSTRIAL APPLICABILITY

As heretofore described, the semiconductor device and semiconductor device manufacturing method according to the invention are useful in a power semiconductor device used in a power conversion device such as a converter or an inverter, a power supply device of various industry machinery, and the like.

REFERENCE SIGNS LIST 1 n⁻ type drift region
1a n-type high concentration region
1b n-type low lifetime adjustment region
2 p-type base region
2a p⁺ type contact region
2-1 Termination p-type base region
3 n⁺ type emitter region
4 Gate dielectric 5 Gate electrode
6 Interlayer dielectric
7 p-type guard ring
8 Field plate
9 Emitter electrode
10 p-type collector region
11 Collector electrode
12 Chip side end surface
13 Substrate surface
14 Dielectric
31 p$^+$ type isolation layer
110 Active region
110a Active region termination portion
120 Edge termination structure portion
130 Isolation region
$t_1$ n-type low lifetime adjustment region carrier lifetime
$t_2$ n-type drift region carrier lifetime

What is claimed is:

1. A semiconductor device, comprising:
an active region including:
an insulated gate structure having a second conductivity type base region selectively provided on a first main surface side of a first conductivity type semiconductor substrate,
a first conductivity type emitter region selectively provided inside the second conductivity type base region, and
a gate electrode provided across a gate dielectric on the surface of a portion of the second conductivity type base region sandwiched by a drift region formed of the first conductivity type semiconductor substrate and the first conductivity type emitter region;
an edge termination structure portion surrounding the outer periphery of the active region;
a second conductivity type collector layer provided on a second main surface side of the first conductivity type semiconductor substrate;
a second conductivity type isolation layer provided in an outer peripheral portion of the edge termination structure portion so as to link the first main surface and the second main surface of the first conductivity type semiconductor substrate and electrically connected to the second conductivity type collector layer; and
a first conductivity type low lifetime adjustment region provided separated from the second conductivity type base region and second conductivity type collector layer in a position inside the drift region deeper than the bottom surface of the second conductivity type base region from the one main surface of the first conductivity type semiconductor substrate,
wherein the first conductivity type low lifetime adjustment region is provided from the active region to the second conductivity type isolation layer,
wherein the center in the depth direction of the first conductivity type low lifetime adjustment region is positioned in a depth range of within 20 μm to the second conductivity type collector layer side from the bottom surface of the outermost second conductivity type base region in the active region
wherein, after the insulated gate structure and a required metal electrode film are formed on the first main surface side of the first conductivity type semiconductor substrate, the first conductivity type low lifetime adjustment region is formed by protons being implanted from the other main surface side of the first conductivity type semiconductor substrate, and a thermal annealing process is performed, and
wherein the protons are implanted in a dose range of $5.0 \times 10^{13}$ cm$^{-2}$ to $5.0 \times 10^{14}$ cm$^{-2}$, and the thermal annealing process is carried out in a hydrogen atmosphere at a temperature of 330° C. to 380° C.

2. The semiconductor device according to claim 1, wherein the depth of the outermost second conductivity type base region in the active region is greater than the depth of the second conductivity type base region positioned inward of the relevant second conductivity type base region.

3. The semiconductor device according to claim 1, wherein the depth of the outermost second conductivity type base region in the active region is equal to the depth of a second conductivity type guard ring configuring the edge termination structure portion.

4. The semiconductor device according to claim 1, additionally comprising a first conductivity type region of an impurity concentration higher than that of the drift region, provided at a depth such that the bottom surface is positioned between the second conductivity type base region positioned inward of the outermost second conductivity type base region in the active region and the first conductivity type low lifetime adjustment region in a portion of the drift region sandwiched between neighboring second conductivity type base regions.

5. The semiconductor device according to claim 1, wherein a carrier lifetime $t_1$ of the first conductivity type low lifetime adjustment region, with a carrier lifetime $t_2$ of the drift region in a range of 0.2 μs to 3.0 μs, has a relationship such that $t_2/t_1$ is 2 to 8.

6. The semiconductor device according to claim 1, wherein a peak concentration $n_1$ of the doping concentration of the first conductivity type low lifetime adjustment region, being higher than a doping concentration $n_2$ of the drift region, has a relationship such that $n_1 > n_2$.

7. The semiconductor device according to claim 1, wherein a peak concentration $n_1$ of the doping concentration of the first conductivity type low lifetime adjustment region, being lower than four times the doping concentration $n_2$ of the drift region, has a relationship such that $n_1 < 4n_2$.

8. The semiconductor device manufacturing method according to claim 1, wherein peak concentration of the doping concentration of the first conductivity type low lifetime adjustment region is adjusted to be within four times the doping concentration of the drift region.

9. The semiconductor device according to claim 1, wherein a carrier lifetime $t_1$ of the first conductivity type low lifetime adjustment region, being shorter than a carrier lifetime $t_2$ of the drift region, has a relationship such that $t_2 > t_1$.

10. A semiconductor device, comprising:
an active region including:
an insulated gate structure having a second conductivity type base region selectively provided on a first main surface side of a first conductivity type semiconductor substrate,
a first conductivity type emitter region selectively provided inside the second conductivity type base region, and
a gate electrode provided across a gate dielectric on the surface of a portion of the second conductivity type base region sandwiched by a drift region formed of the first conductivity type semiconductor substrate and the first conductivity type emitter region;
an edge termination structure portion surrounding the outer periphery of the active region;

a second conductivity type collector layer provided on a second main surface side of the first conductivity type semiconductor substrate;

a second conductivity type isolation layer provided in an outer peripheral portion of the edge termination structure portion so as to link the first main surface and the second main surface of the first conductivity type semiconductor substrate and electrically connected to the second conductivity type collector layer; and a first conductivity type low lifetime adjustment region provided separated from the second conductivity type base region and second conductivity type collector layer in a position inside the drift region deeper than the bottom surface of the second conductivity type base region from the one main surface of the first conductivity type semiconductor substrate, wherein the first conductivity type low lifetime adjustment region is provided from the active region to the second conductivity type isolation layer, wherein the center in the depth direction of the first conductivity type low lifetime adjustment region is positioned in a depth range of within 20 μm to the second conductivity type collector layer side from the bottom surface of the outermost second conductivity type base region in the active region, wherein the helium is ion implanted in an energy range of 2.0 MeV to 5.5 MeV, and the thermal annealing process is carried out in a hydrogen atmosphere at a temperature of 380° C. or less, wherein, after the insulated gate structure and a required metal electrode film are formed on the first main surface side of the first conductivity type semiconductor substrate, the first conductivity type low lifetime adjustment region is formed by helium irradiation from the same main surface side of the first conductivity type semiconductor substrate, and a thermal annealing process is performed.

11. The semiconductor device manufacturing method according to claim 10, wherein the lifetime of the first conductivity type low lifetime adjustment region is adjusted by electron irradiation.

12. The semiconductor device manufacturing method according to claim 10, wherein peak concentration of the doping concentration of the first conductivity type low lifetime adjustment region is adjusted to be within four times the doping concentration of the drift region.

13. The semiconductor device according to claim 10, wherein a carrier lifetime $t_1$ of the first conductivity type low lifetime adjustment region, being shorter than a carrier lifetime $t_2$ of the drift region, has a relationship such that $t_2 > t_1$.

* * * * *